(12) United States Patent
Bae et al.

(10) Patent No.: US 12,219,818 B2
(45) Date of Patent: Feb. 4, 2025

(54) DISPLAY DEVICE

(71) Applicant: SAMSUNG DISPLAY CO., LTD., Yongin-si (KR)

(72) Inventors: Sung Geun Bae, Hwaseong-si (KR); Jang Soon Park, Asan-si (KR); Jeong Hyun Lee, Asan-si (KR); Jong Chan Lee, Suwon-si (KR); Da Sol Jeong, Seoul (KR); Won Hyeong Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 728 days.

(21) Appl. No.: 17/519,145

(22) Filed: Nov. 4, 2021

(65) Prior Publication Data

US 2022/0190071 A1    Jun. 16, 2022

(30) Foreign Application Priority Data

Dec. 11, 2020 (KR) .................. 10-2020-0173292

(51) Int. Cl.
*H01L 27/32* (2006.01)
*H10K 59/122* (2023.01)
(52) U.S. Cl.
CPC ................... *H10K 59/122* (2023.02)
(58) Field of Classification Search
None
See application file for complete search history.

(56) References Cited

U.S. PATENT DOCUMENTS

2019/0013372 A1    1/2019 Yasukawa et al.
2021/0091050 A1*   3/2021 Heo ............... H01L 33/44
(Continued)

FOREIGN PATENT DOCUMENTS

JP        2016-152155 A    8/2016
KR   10-2020-0134908 A   12/2020
(Continued)

OTHER PUBLICATIONS

International Search Report dated Mar. 21, 2022 for corresponding PCT Application No. PCT/KR2021/018633 (3 pages).
(Continued)

*Primary Examiner* — William C Trapanese
(74) *Attorney, Agent, or Firm* — Lewis Roca Rothgerber Christie LLP

(57) ABSTRACT

A display device includes a plurality of outer banks extending in a first direction and are spaced from one another in a second direction that intersects the first direction, first and second bank parts spaced from the plurality of outer banks in the second direction between the outer banks, and spaced from each other in the first direction, first and second inner banks extending in the first direction between the plurality of outer banks, the first and second inner banks being spaced from each other in the second direction, first and second electrodes on the first and second inner banks, respectively, and spaced from each other in the second direction, light-emitting elements having first end portions on one of the first and second electrodes, the light-emitting elements being arranged along the first direction, and a first insulating layer including a first pattern portion between the first and second inner banks.

20 Claims, 25 Drawing Sheets

(56) References Cited

U.S. PATENT DOCUMENTS

2022/0052033 A1    2/2022  Lee
2022/0393071 A1*  12/2022  Moon .................... H01L 27/12

FOREIGN PATENT DOCUMENTS

| KR | 10-2020-0137847 A | 12/2020 |
| KR | 10-2020-0138479 A | 12/2020 |
| KR | 10-2022-0021949 A | 2/2022 |

OTHER PUBLICATIONS

Written Opinion dated Mar. 21, 2022 for corresponding PCT Application No. PCT/KR2021/018633 (4 pages).

\* cited by examiner

DISPLAY DEVICE

CROSS-REFERENCE TO RELATED APPLICATION

This application claims priority to and the benefit of Korean Patent Application No. 10-2020-0173292 filed on Dec. 11, 2020 in the Korean Intellectual Property Office, the entire content of which is incorporated herein by reference.

BACKGROUND

1. Field

The present disclosure relates to a display device.

2. Description of the Related Art

Display devices are becoming more important with developments in multimedia technology. Accordingly, various display devices such as a liquid crystal display (LCD) device, an organic light-emitting diode (OLED) display device, and the like have been used.

A typical display device includes a display panel for displaying an image, such as an OLED display panel or an LCD panel. A light-emitting display panel, which is a type of display panel, may include light-emitting elements such as, for example, light-emitting diodes (LEDs). The LEDs may be classified into OLEDs using an organic material as a light-emitting material and inorganic LEDs (ILEDs) using an inorganic material as a light-emitting material.

SUMMARY

One or more embodiments of the present disclosure provide a display device capable of preventing a short circuit that may be caused by any materials remained from the formation of electrodes.

However, embodiments of the present disclosure are not limited to those set forth herein. The above and other embodiments of the present disclosure will become more apparent to one of ordinary skill in the art to which the present disclosure pertains by referencing the detailed description of the present disclosure provided below.

According to the aforementioned and other embodiments of the present disclosure, height differences generated by banks of a bank layer, which are spaced from one another, can be compensated for by filling the gaps between the banks or between bank parts. As a result, connecting electrodes on the bank layer can be on a flat surface, and almost no residues can be left behind during patterning for forming the connecting electrodes. The connecting electrodes can be prevented from being short-circuited by any residues between the connecting electrodes.

According to an embodiment of the present disclosure, a display device includes a plurality of outer banks extending in a first direction and are spaced from one another in a second direction that intersects the first direction, first and second bank parts spaced from the plurality of outer banks in the second direction between the plurality of outer banks, and spaced from each other in the first direction, first and second inner banks extending in the first direction between the plurality of outer banks, the first and second inner banks being spaced from each other in the second direction, first and second electrodes on the first and second inner banks, respectively, and spaced from each other in the second direction, a plurality of light-emitting elements having first end portions on one of the first and second electrodes, the plurality of light-emitting elements being arranged along the first direction, and a first insulating layer including a first pattern portion between the first and second inner banks, the first pattern portion partially covering the plurality of light-emitting elements, and a plurality of second pattern portions between the first bank part and the outer banks.

The outer banks may include bank extension portions extending in the first direction, and a plurality of bank protrusion portions protruding on both sides of the bank extension portions in the second direction, the bank protrusion portions may include a first bank protrusion portions and a second bank protrusion portions spaced from the first bank protrusion portions in the first direction, the first bank part may be between first bank protrusion portions of different outer banks, the second bank part may be between second bank protrusion portions of different outer banks, and the plurality of second pattern portions may be between the first bank part and the first bank protrusion portions.

Each of the first and second inner banks may be at an area surrounded by the first bank protrusion portions, the first bank part, the second bank protrusion portions, and the second bank part.

The respective parts of the first and second electrodes may be on electrode contact holes located between the first bank protrusion portions and the first bank part, and the plurality of second pattern portions may be on the electrode contact holes.

The plurality of second pattern portions may be in contact with the first bank protrusion portions and the first bank part.

The first insulating layer may further include a third pattern portion connecting the first pattern portion and the plurality of second pattern portions, and the third pattern portion may extend in the second direction between the first inner bank, the second inner bank, and the first bank part, and be in direct contact with the first bank part.

The display device may further include a first connecting electrode on the first electrode and extending in the first direction, the first connecting electrode being in contact with first end portions of the light-emitting elements, and a second connecting electrode on the second electrode and extending in the first direction, the second connecting electrode being in contact with second end portions of the light-emitting elements, wherein at least a portion of the first and second connecting electrodes may be on the third pattern portion and the first bank part.

The display device may further include a third inner bank between the first and second inner banks, and a third electrode on the third inner bank, wherein the third electrode may include a first electrode extension at one side of the third inner bank, a second electrode extension at an other side of the third inner bank, and a plurality of electrode connectors connecting the first and second electrode extensions.

The plurality of light-emitting elements may include first light-emitting elements on the first electrode and the first electrode extension, and second light-emitting elements on the second electrode and the second electrode extension, and first end portions of the first light-emitting elements and first end portions of the second light-emitting elements may face one side in the second direction.

A plurality of first pattern portions may be between the first and third inner banks and between the second and third inner banks.

The first bank parts may be between the first bank protrusion portions that are spaced from one another in the second direction, the second bank parts may be between the second bank protrusion portions that are spaced from one another in the second direction, the electrode connectors of the third electrode may include protruding parts that protrude in the first direction, and the protruding parts may be between the first bank parts or between the second bank parts.

The plurality of second pattern portions may be between the first bank part and the first bank protrusion portions, and the first insulating layer may further include a third pattern portion connecting a plurality of first pattern portions and the plurality of second pattern portions.

The display device may further include a second insulating layer covering the first inner bank, the second inner bank, the first electrode, and the second electrode, the second insulating layer being spaced from the first and second bank parts, wherein the first insulating layer may be between the first bank part and the first bank protrusion portions.

According to an embodiment of the present disclosure, a display device includes a substrate, a via layer on the substrate, a plurality of outer banks spaced from one another on the via layer, a plurality of bank parts on the via layer between the plurality of outer banks, and spaced from the outer bank, first and second electrodes that are spaced from one another between the plurality of outer banks, at least a portion of the first and second electrodes being located between the plurality of outer banks and the plurality of bank parts, a first insulating layer covering the first and second electrodes, the first insulating layer being spaced from the plurality of outer banks and the plurality of bank parts, a plurality of light-emitting elements having at least first end portions on the first or second electrode, and a second insulating layer including a first pattern portion partially covering the light-emitting elements, and a plurality of second pattern portions between the plurality of outer banks and the plurality of bank parts.

The plurality of outer banks may extend in a first direction and be spaced from one another in a second direction that intersects the first direction, the display device may further include first and second inner banks spaced from the plurality of bank parts in the first direction, and at least parts of the first and second electrodes are on the first and second inner banks.

The display device may further include a conductive layer between the via layer and the substrate, and first and second electrode contact holes between the bank parts and the plurality of outer banks, the first and second electrode contact holes exposing parts of the conductive layer through the via layer, wherein the first and second electrode contact holes may be spaced from each other by the bank parts.

The first electrode may be in contact with the conductive layer through the first electrode contact hole, the second electrode may be in contact with the conductive layer through the second electrode contact hole, and the plurality of second pattern portions of the second insulating layer may overlap with the first and second electrode contact holes in a thickness direction of the display device.

Side surfaces of each of the plurality of second pattern portions of the second insulating layer may be in direct contact with the bank parts.

The second insulating layer may further include a third pattern portion that connects the first pattern portion and the second pattern portions, and the third pattern portion may be between the bank parts that are spaced from the first and second inner banks in the first direction.

The first and second inner banks may have same thickness as the plurality of outer banks and the plurality of bank parts.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
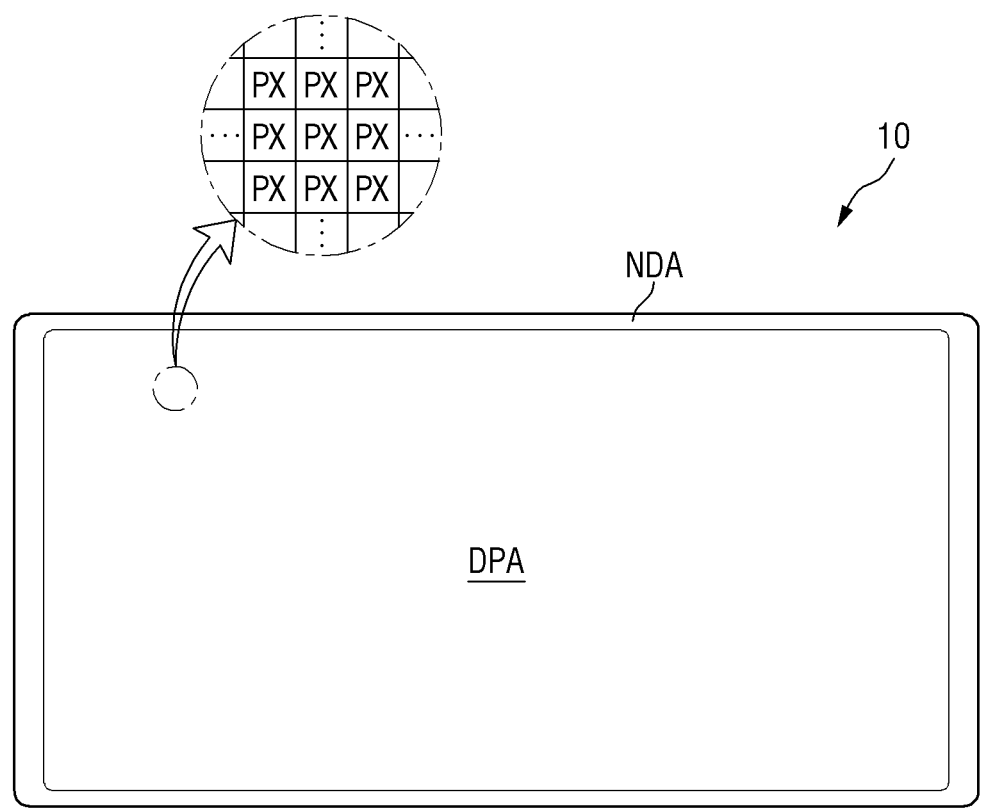
FIG. 1 is a plan view of a display device according to an embodiment of the present disclosure.

The present disclosure will now be described more fully hereinafter with reference to the accompanying drawings, in which embodiments of the present disclosure are shown. The embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Hereinafter, embodiments of the present disclosure will be described with reference to the accompanying drawings.

FIG. 1 is a plan view of a display device according to an embodiment of the present disclosure.

Referring to FIG. 1, a display device 10 displays a moving image (e.g., a video) or a still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the present disclosure is not limited thereto. That is, various other display panels are also applicable to the display panel of the display device 10.

The shape of the display device 10 may vary. In one example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends in a second direction DR2.

The display device 10 may include the display area DPA and a non-display area NDA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part of the display device 10.

The display area DPA may include a plurality of pixels PX. The pixels PX may be arranged in row and column directions. For example, the pixels PX may be arranged along rows and columns of a matrix. The pixels PX may have a rectangular or square shape in a plan view, but the present disclosure is not limited thereto. Alternatively, the pixels PX may have a rhombus shape having sides that are inclined with respect to a particular direction. The pixels PX may be arranged in a stripe structure or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PX may include one or more light-emitting elements that emit light of a particular wavelength range.

The non-display area NDA may be disposed around the display area DPA along an edge or periphery of the display area DPA. The non-display area NDA may surround the entire display area DPA or part of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
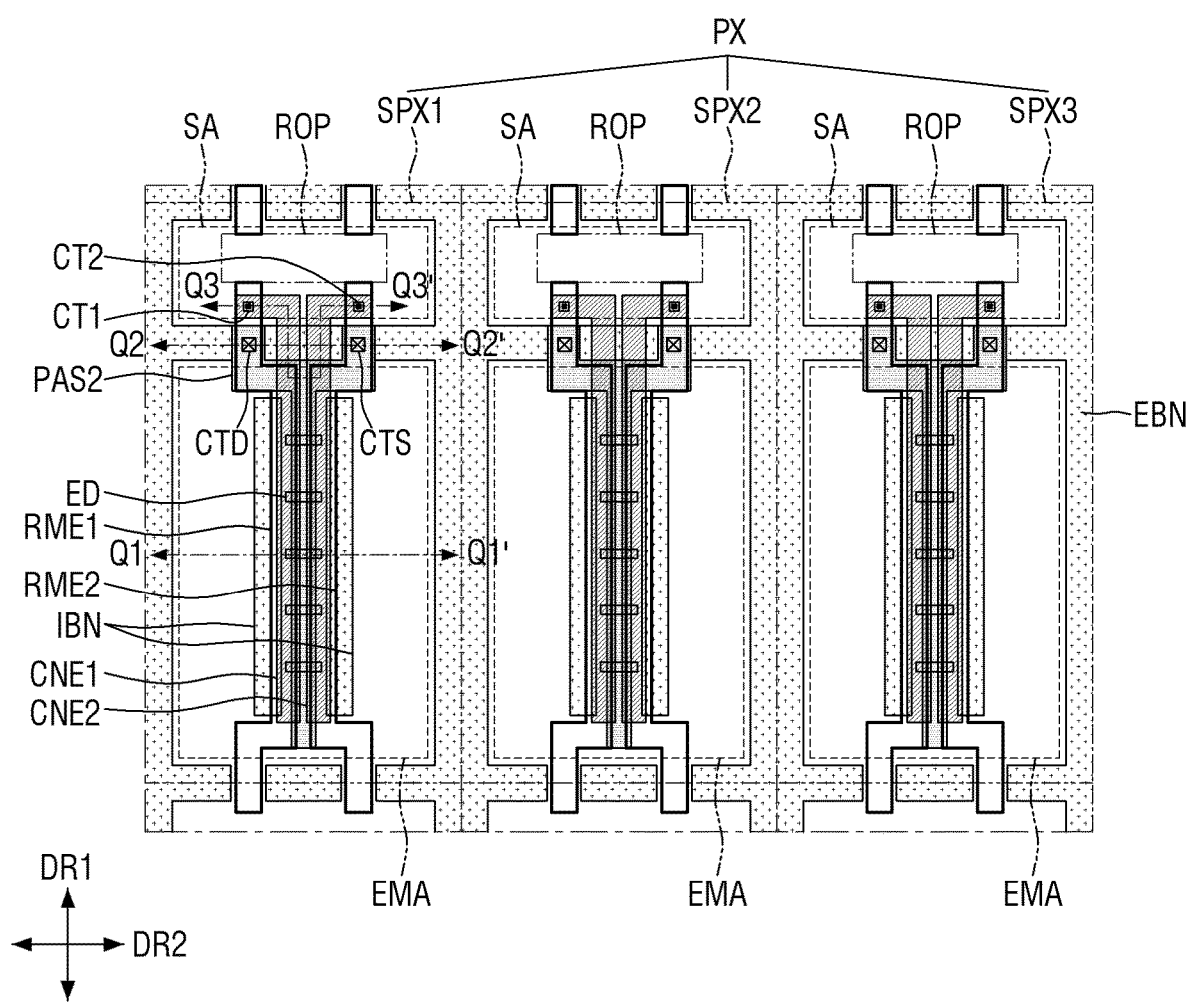
FIG. 2 is a plan view of a pixel of the display device of FIG. 1.

FIG. 2 is a plan view of a pixel of the display device. FIG. 2 illustrates one pixel PX and part of another pixel PX adjacent thereto in a first direction DR1.

Referring to FIG. 2, a pixel PX may include a plurality of subpixels SPXn (where n is an integer of 1 to 3). In one example, the pixel PX may include first, second, and third subpixels SPX1, SPX2, and SPX3. The first subpixel SPX1 may emit a first-color light, the second subpixel SPX2 may emit a second-color light, and the third subpixel SPX3 may emit a third-color light. In one example, the first-color light, the second-color light, and the third-color light may be blue light, green light, and red light, respectively, but the present disclosure is not limited thereto. Alternatively, the subpixels SPXn may all emit light of the same color. In one example, the subpixels SPXn may all emit blue light. FIG. 2 illustrates that the pixel PX may include three subpixels SPXn, but the present disclosure is not limited thereto. Alternatively, the pixel PX may include more than three subpixels SPXn.

Each of the subpixels SPXn may include an emission area EMA and a non-emission area. The emission area EMA may be an area that outputs light of a particular wavelength range due to light-emitting elements ED being disposed therein. The non-emission area may be an area that has no light-emitting elements ED disposed therein, is not reached by light emitted by light-emitting elements ED, and thus does not output light.

The emission area EMA may include a region in which light-emitting elements ED are disposed and regions around the light-emitting elements ED that output light emitted by the light-emitting elements ED. However, the present disclosure is not limited to this. The emission area EMA may also include regions that output light emitted by the light-emitting elements ED and then reflected or refracted by other members. A plurality of light-emitting elements ED may be disposed in each of the subpixels SPXn to form an emission area EMA including a region in which the plurality of light-emitting elements ED are disposed and the surroundings of the region in which the plurality of light-emitting elements ED are disposed.

FIG. 2 illustrates that the emission areas EMA of the first, second, and third subpixels SPX1, SPX2, and SPX3 have substantially the same size. In some embodiments, the emission areas EMA of the subpixels SPXn may have different sizes depending on the color or the wavelength of light emitted by light-emitting elements ED.

Each of the subpixels SPXn may further include a subarea SA that is disposed in the non-emission area of the display device 10. The subarea SA may be disposed on a first side, in the first direction DR1, of the emission area EMA, between the emission area EMA of the corresponding subpixel SPXn and an emission area EMA of a neighboring subpixel SPXn that is adjacent to the corresponding subpixel SPXn in the first direction DR1. In one example, a plurality of emission areas EMA may be arranged one after another along the second direction DR2, a plurality of subareas SA may be arranged one after another along the second direction DR2, and the plurality of emission areas EMA and the plurality of subareas SA may be alternately arranged along the first direction DR1. However, the present disclosure is not limited to this example. The plurality of emission areas EMA and the plurality of subareas SA may be arranged in a different layout from that illustrated in FIG. 2. FIG. 2 illustrates that one emission area EMA and one subarea SA are provided in each of the subpixels SPXn and the subarea SA and another subarea SA are disposed on first and second sides, respectively, in the first direction DR1, of the emission area EMA, for example, on the upper and lower sides, respectively, of the emission area EMA.

As no light-emitting elements ED are disposed in the sub-area SA of each of the subpixels SPXn, electrodes RME may be disposed in part in the subarea SA of each of the subpixels SPXn. In a separation part ROP of the subarea SA of each of the subpixels SPXn, the electrodes RME may be separated from electrodes RME of the neighboring subpixel SPXn that is adjacent to the corresponding subpixel SPXn in the first direction DR1.

Outer banks EBN may be disposed between each pair of subpixels SPXn that are adjacent to one another in the second direction DR2. Also, the outer banks EBN and a plurality of bank parts BP (of FIG. 3) may be disposed between each pair of subpixels SPXn that are adjacent to one another in the first direction DR1 or between emission areas EMA and subareas SA. The outer banks EBN and the bank parts BP may separate the emission areas EMA and the subareas SA together. That is, the outer banks EBN and the bank parts BP may be arranged substantially in a lattice form in the display area DPA to expose parts of the display area DPA. The exposed parts of the display area DPA may be defined as the emission areas EMA or the subareas SA, and one emission area EMA and one subarea SA may be included in one subpixel SPXn. The bank parts BP may be spaced from the outer banks EBN in the second direction DR2. The emission areas EMA and the subareas SA may be spatially connected through the gaps between the outer banks EBN and the bank parts BP.

Figure 3:
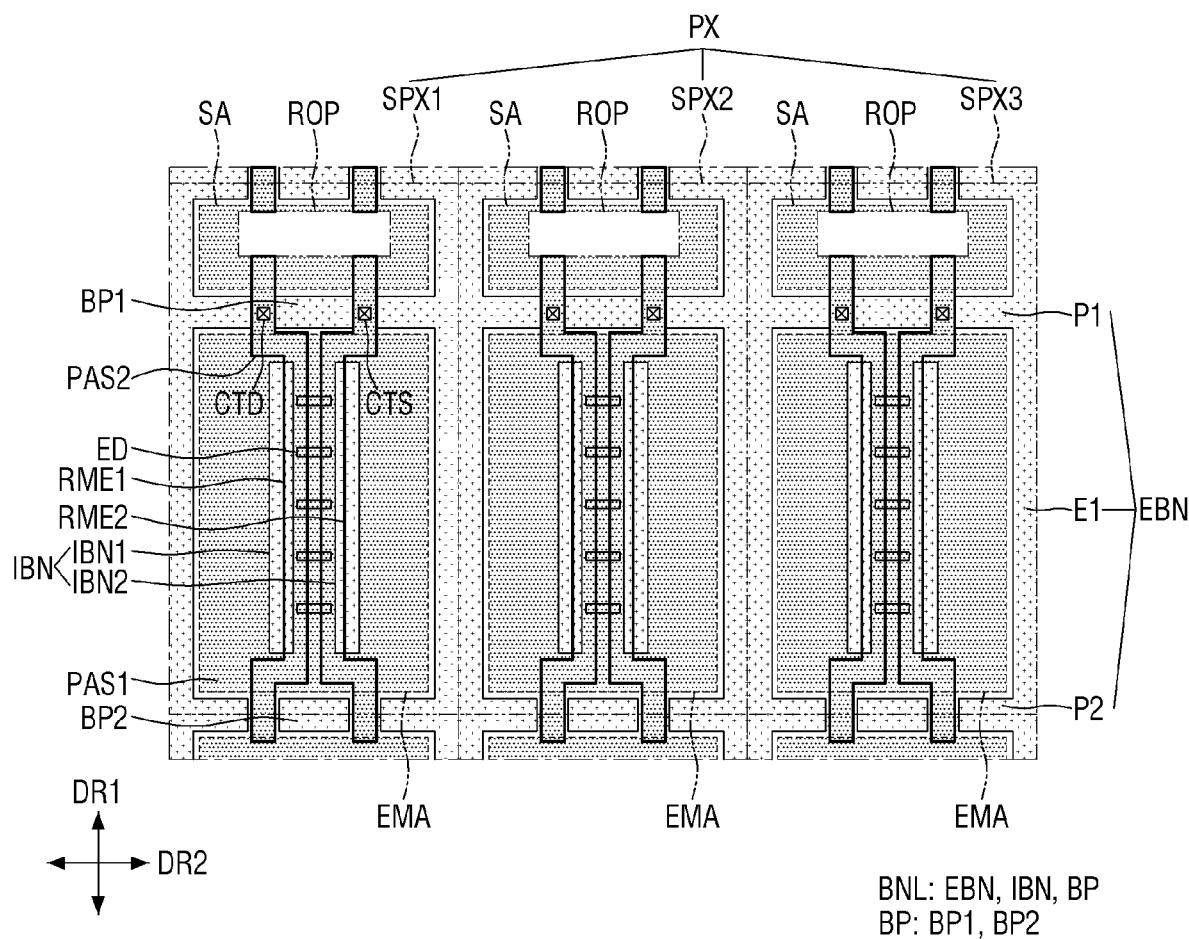
FIG. 3 is a plan view illustrating the layout of a bank layer, a plurality of electrodes, and a first insulating layer in the pixel of FIG. 2.
Figure 4:
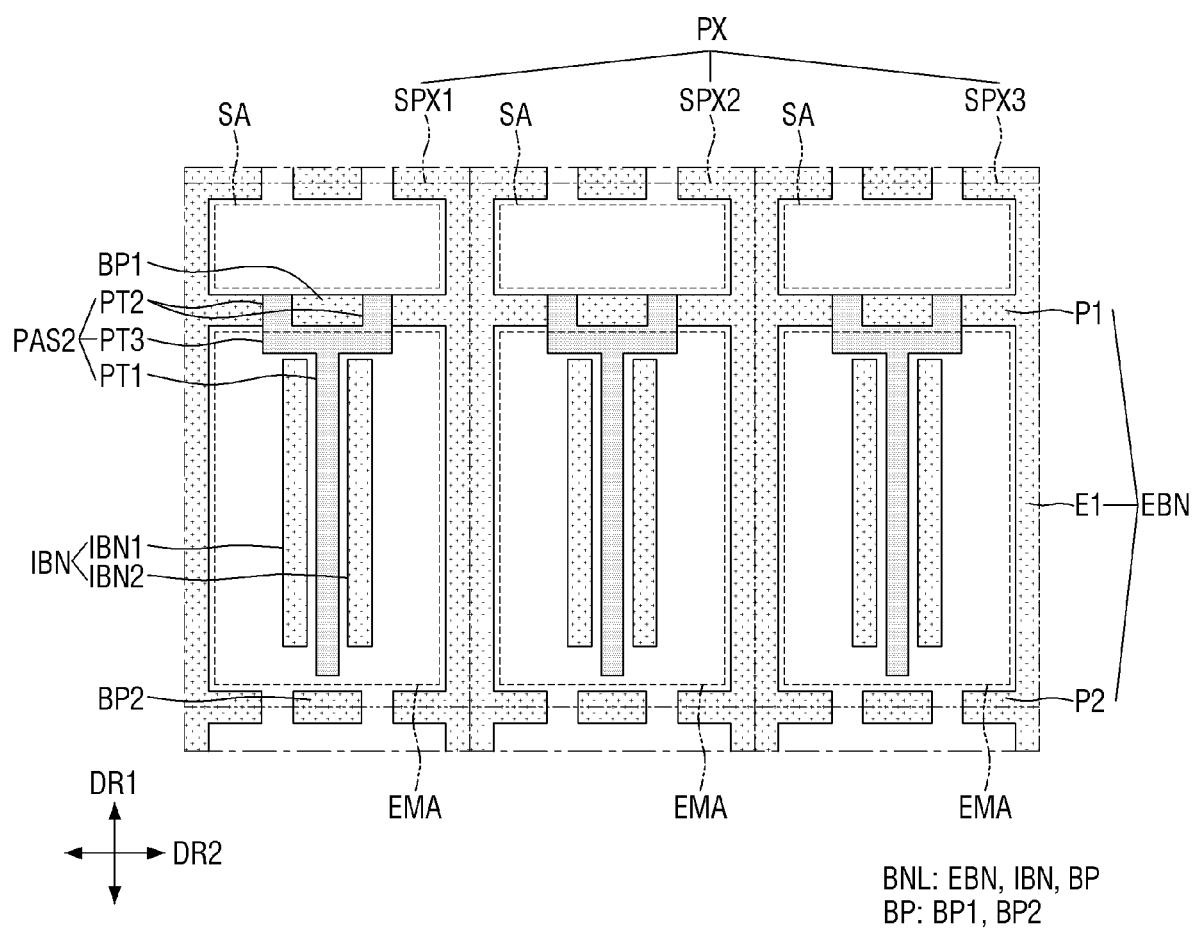
FIG. 4 is a plan view illustrating the layout of the bank layer and a second insulating layer in the pixel of FIG. 2.
Figure 5:
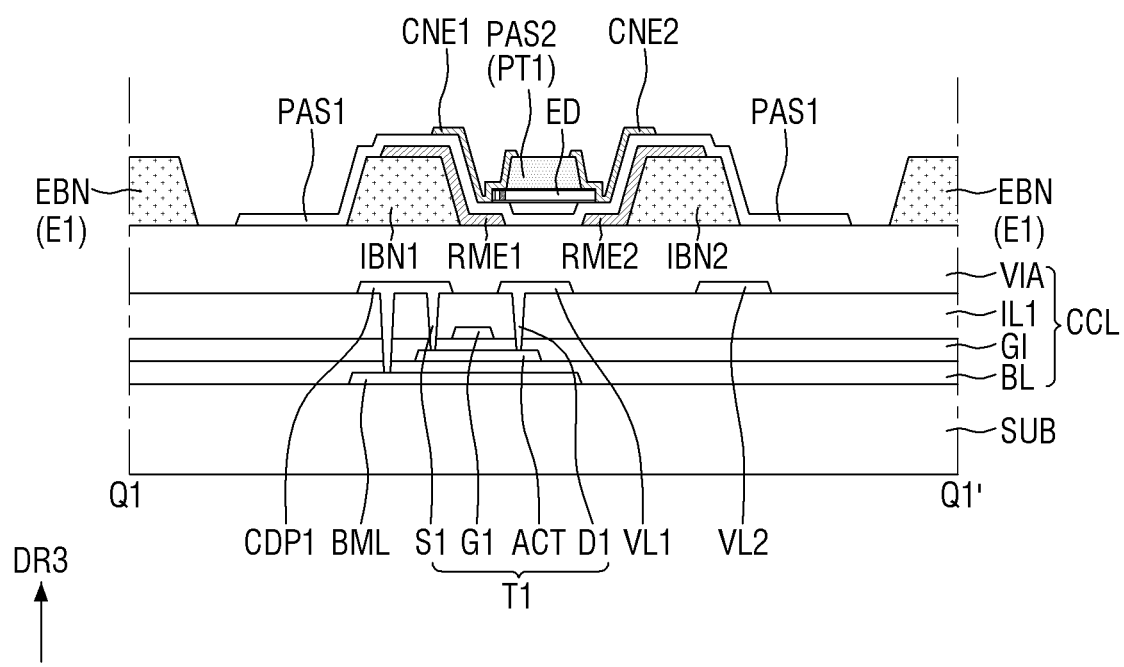
FIG. 5 is a cross-sectional view taken along the line Q1-Q1' of FIG. 2.
Figure 6:
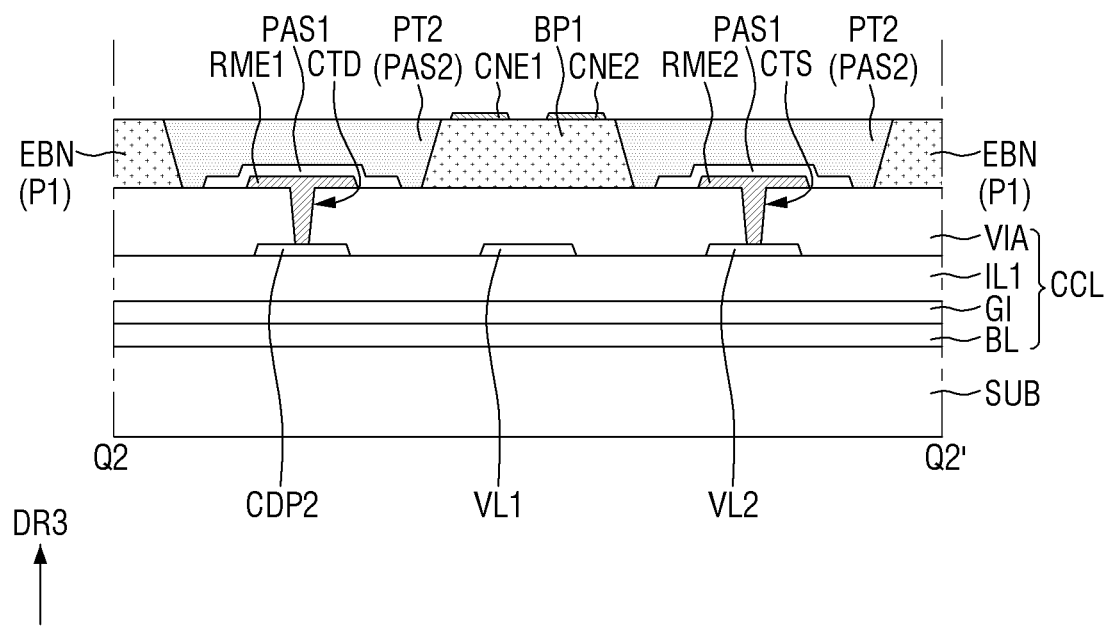
FIG. 6 is a cross-sectional view taken along the line Q2-Q2' of FIG. 2.
Figure 7:
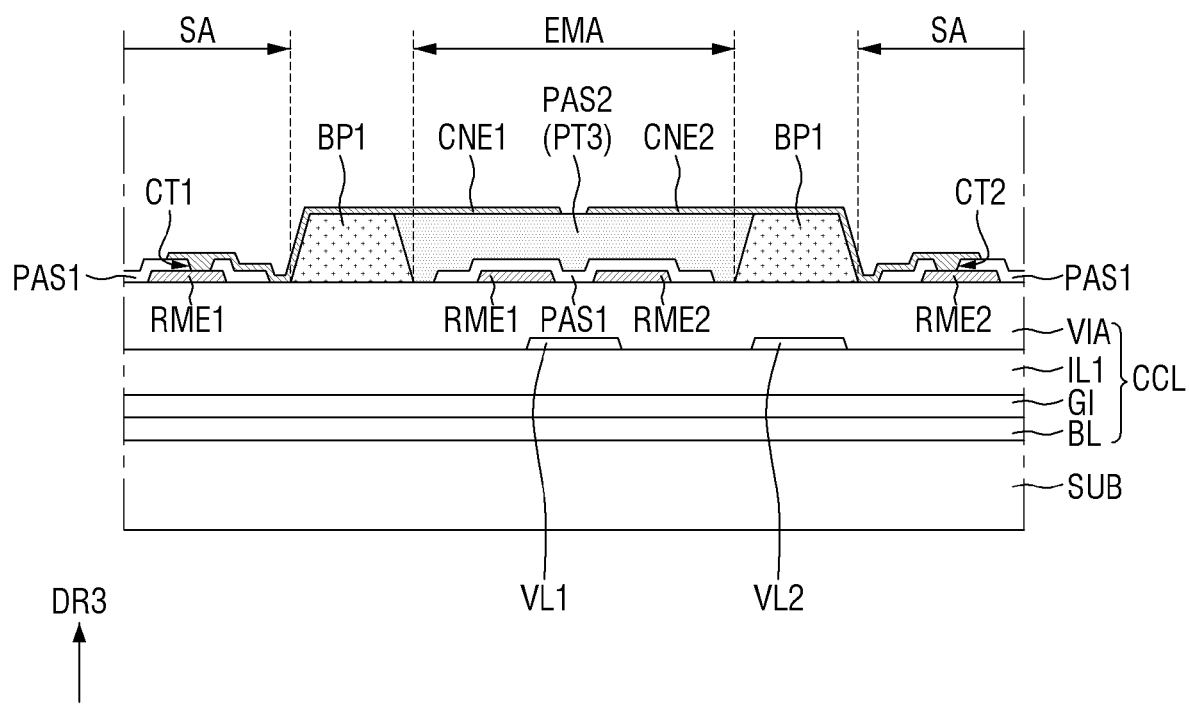
FIG. 7 is a cross-sectional view taken along the line Q3-Q3' of FIG. 2.

FIG. 3 is a plan view illustrating the layout of a bank layer, a plurality of electrodes, and a first insulating layer in the pixel of FIG. 2. FIG. 4 is a plan view illustrating the layout of the bank layer and a second insulating layer in the pixel of FIG. 2. FIG. 5 is a cross-sectional view taken along the line Q1-Q1' of FIG. 2. FIG. 6 is a cross-sectional view taken along the line Q2-Q2' of FIG. 2. FIG. 7 is a cross-sectional view taken along the line Q3-Q3' of FIG. 2.

FIGS. 3 and 4 illustrate only some of the layers disposed in the pixel PX of FIG. 2. FIG. 5 illustrates a cross-sectional view taken from one end to the other end of each of the light-emitting elements ED of the first subpixel SPX1 of FIG. 2. FIG. 6 illustrates a cross-sectional view taken across a first bank part BP1 and first bank protrusion portions P1 disposed between the emission area EMA and the subarea SA of the first subpixel SPX1 of FIG. 2. FIG. 7 illustrates a cross-sectional view taken across a plurality of contacts (CT1 and CT2) disposed in the subarea SA of the first subpixel SPX1 of FIG. 2 and part of a second insulating layer PAS2 disposed in the emission area EMA of the first subpixel SPX1 of FIG. 2.

Referring to FIGS. 3-7 and further to FIG. 2, the display device 10 may include the first substrate SUB and may further include a semiconductor layer, a plurality of conductive layers, and a plurality of insulating layers that are disposed on the first substrate SUB. The semiconductor layer, the conductive layers, and the insulating layers may form a circuit layer CCL and a display element layer of the display device 10.

For example, the first substrate SUB may be an insulating substrate. The first substrate SUB may be formed of an insulating material such as glass, quartz, or a polymer resin. The first substrate SUB may be a rigid substrate or may be a flexible substrate that is bendable, foldable, and/or rollable.

A first conductive layer may be disposed on the first substrate SUB. The first conductive layer includes a lower metal layer BML, and the lower metal layer BML is disposed to overlap with an active layer ACT of a first transistor T1 in a thickness direction of the first substrate SUB (i.e., a third direction DR3). The lower metal layer BML may include a material capable of blocking the transmission of light and may prevent light from being incident upon the active layer ACT of the first transistor T1. The lower metal layer BML may not be provided in some embodiments.

A buffer layer BL may be disposed on the lower metal layer BML and the first substrate SUB. The buffer layer BL may be formed on the first substrate SUB to protect the transistors of the first subpixel SPX1 from moisture that may penetrate through the first substrate SUB, which is vulnerable to moisture, and may perform a surface planarization function.

The semiconductor layer is disposed on the buffer layer BL. The semiconductor layer may include the active layer ACT of the first transistor T1. The active layer ACT may be disposed to partially overlap, in the thickness direction of the first substrate SUB (i.e., a third direction DR3), with a gate electrode G1 of the first transistor T1 in a second conductive layer that will be described later.

The semiconductor layer may include polycrystalline silicon, monocrystalline silicon, or an oxide semiconductor. Alternatively, the semiconductor layer may include polycrystalline silicon. The oxide semiconductor may be an oxide semiconductor containing indium (In). In one example, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

FIGS. 3-7 (e.g., FIG. 5) illustrate that the first subpixel SPX1 includes only one transistor, i.e., the first transistor T1, but the present disclosure is not limited thereto. That is, the first subpixel SPX1 may include more than one transistor.

A first gate insulating layer GI is disposed on the semiconductor layer and the buffer layer BL. The first gate insulating layer GI may function as a gate insulating film for the first transistor T1.

A second conductive layer is disposed on the first gate insulating layer GI. The second conductive layer may include a gate electrode G1 of the first transistor T1. The gate electrode G1 may be disposed to overlap with the channel region of the active layer ACT1 in the thickness direction of the substrate SUB, i.e., in the third direction DR3.

A first interlayer insulating layer IL1 is disposed on the second conductive layer and the first gate insulating layer GI. The first interlayer insulating layer IL1 may function as an insulating film between the second conductive layer and layers disposed on the second conductive layer and may protect the second conductive layer.

A third conductive layer is disposed on the first interlayer insulating layer IL1. The third conductive layer may include first and second voltage lines VL1 and VL2 and a plurality of conductive patterns (CDP1 and CDP2).

A high-potential voltage (or a first power supply voltage) to be delivered to a first electrode RME1 may be applied to the first voltage line VL1, and a low-potential voltage (or a second power supply voltage) to be delivered to a second electrode RME2 may be applied to the second voltage line VL2. Part of the first voltage line VL1 may be in contact with the active layer ACT of the first transistor T1 through a contact hole that penetrates the first interlayer insulating layer IL1 and the first gate insulating layer GI. The first voltage line VL1 may function as a first drain electrode D1 of the first transistor T1. The second voltage line VL2 may be connected directly to the second electrode RME2.

A first conductive pattern CDP1 may be in contact with the active layer ACT1 of the first transistor T1 through a contact hole that penetrates the first interlayer insulating layer IL1 and the first gate insulating layer GI. Also, the first conductive pattern CDP1 may be in contact with the lower metal layer BML through another contact hole that penetrates the first interlayer insulating layer IL1, the first gate insulating layer GI, and the buffer layer BL. The first conductive pattern CDP1 may function as a first source electrode S1 of the first transistor T1.

A second conductive pattern CDP2 may be connected to the first electrode RME1. Also, the second conductive pattern CDP2 may be electrically connected to the first transistor T1 via the first conductive pattern CDP1. The first and second conductive patterns CDP1 and CDP2 are illustrated as being separate from each other, but the present disclosure is not limited thereto. Alternatively, the first and second conductive patterns CDP1 and CDP2 may be integrated into a single pattern. The first transistor T1 may transmit the first power supply voltage from the first voltage line VL1 to the first electrode RME1.

The first and second conductive patterns CDP1 and CDP2 are illustrated as being formed in the same layer, but the present disclosure is not limited thereto. Alternatively, the second conductive pattern CDP2 may be formed in a different conductive layer from the first conductive pattern CDP1, for example, in a fourth conductive layer disposed on the third conductive layer with a number of insulating layers interposed therebetween. In this case, the first and second voltage lines VL1 and VL2 may be formed in the fourth conductive layer, rather than in the third conductive layer, and the first voltage line VL1 may be electrically connected to the drain electrode D1 of the first transistor T1 via another conductive pattern.

Each of the buffer layer BL, the first gate insulating layer GI, and the first interlayer insulating layer IL1 may consist of a plurality of inorganic layers that are alternately stacked. In one example, each of the buffer layer BL, the first gate insulating layer GI, and the first interlayer insulating layer IL1 may be formed as a double or multilayer in which inorganic layers of at least one of silicon oxide ($SiO_x$), silicon nitride ($SiN_x$), and silicon oxynitride ($SiO_xN_y$) are alternately stacked, but the present disclosure is not limited thereto. In another example, each of the buffer layer BL, the first gate insulating layer GI, and the first interlayer insulating layer IL1 may be formed as a single inorganic layer including silicon oxide ($SiO_x$), silicon nitride ($SiN_x$), or silicon oxynitride ($SiO_xN_y$). Also, in some embodiments, the first interlayer insulating layer IL1 may be formed of an organic insulating material such as polyimide (PI).

The second and third conductive layers may be formed as single layers or multilayers including molybdenum (Mo), aluminum (Al), chromium (Cr), gold (Au), titanium (Ti), nickel (Ni), neodymium (Nd), copper (Cu), or an alloy thereof, but the present disclosure is not limited thereto.

A via layer VIA is disposed on the third conductive layer. The via layer VIA may include an organic insulating material such as, for example, PI, and may perform a surface planarization function.

A plurality of inner banks IBN, outer banks EBN, bank parts BP, a plurality of electrodes RME, a plurality of light-emitting elements ED, and a plurality of connecting electrodes CNE may be disposed on the via layer VIA as parts of the display element layer. A plurality of first and second insulating layers PAS1 and PAS2 may be disposed on the via layer VIA.

A bank layer BNL may be disposed directly on the via layer VIA. The bank layer BNL may include the outer banks EBN and a plurality of bank parts BP, which are disposed along the boundaries of each of the subpixels SPXn or between the emission area EMA and the subarea SA of each of the subpixels SPXn, and inner banks IBN, which are disposed in the emission area EMA of each of the subpixels SPXn.

The inner banks IBN may extend in the first direction DR1 and may be spaced from each other in the second direction DR2. The inner banks IBN may be disposed within the emission area EMA surrounded by bank extension portions E1 and first bank protrusion portions P1 of the outer banks EBN and bank parts BP. The inner banks IBN may include a first inner bank IBN1, which is disposed on one side, in the second direction DR2, of the center (or the central region) of the emission area EMA of each of the subpixels SPXn, for example, on the left side of the center (or the central region) of each of the subpixels SPXn, and a second inner bank IBN2, which is spaced from the first inner bank IBN1 in the second direction DR2 and is disposed on the other side, in the second direction DR2, of the center (or the central region) of the emission area EMA of each of the subpixels SPXn, for example, on the right side of the center (or the central region) of each of the subpixels SPXn. The inner banks IBN may have the same width, but the present disclosure is not limited thereto. Alternatively, some of the inner banks IBN may have different widths. The inner banks IBN may form island patterns that extend in one direction (e.g., the first direction DR1) with a small width in the emission area EMA of each of the subpixels SPXn, over the entire display area DPA. A plurality of light-emitting elements ED may be disposed between the inner banks IBN that are spaced from each other.

The outer banks EBN may extend in the first direction DR1 and may be spaced from each other in the second direction DR2. The outer banks EBN may separate each pair of subpixels SPXn that are adjacent to one another in the second direction DR2, and the distances between the emission areas EMA of the subpixels SPXn and between the subareas SA of the subpixels SPXn may vary depending on the width of the outer banks EBN.

The outer banks EBN may include the bank extension portions E1, which extend in the first direction DR1, and a plurality of bank protrusion portions (P1 and P2), which are projected from the bank extension portions E1 in the second direction DR2. The bank extension portions E1 of the outer banks EBN may be relatively narrow, and the bank protrusion portions (P1 and P2) of the outer banks EBN may be relatively wide. The outer banks EBN may have a shape that generally extends in the first direction DR1 and has parts that extend in the second direction DR2.

The bank protrusion portions (P1 and P2) of the outer banks EBN may be disposed between the emission areas EMA and the subareas SA of the subpixels SPXn. The first bank protrusion portions P1 may be disposed between the emission area EMA and the subarea SA of each of the subpixels SPXn, and second bank protrusion portions P2 may be disposed between the emission area EMA of each of the subpixels SPXn and the subarea SA of the neighboring subpixel SPXn that are adjacent to the corresponding subpixel SPXn in the first direction DR1. The bank protrusion portions (P1 and P2) may be spaced from each other in the second direction DR2 and may have the same width.

A plurality of bank parts BP may be disposed between the bank protrusion portions (P1 and P2) of the outer banks EBN. A first bank part BP1 may be disposed between the first bank protrusion portions P1 of the outer banks EBN, and a second bank part BP2 may be disposed between the second bank protrusion portions P2 of the outer banks EBN. The bank parts BP and the bank protrusion portions (P1 and P2) of the outer banks EBN may separate the subpixels SPXn and may also separate the emission areas EMA and the subareas SA of the subpixels SPXn together. The first bank protrusion portions P1 and the first bank part BP1 may separate the emission area EMA and the subarea SA of each of the subpixels SPXn, and the second bank protrusion portions P2 and the second bank part BP2 may separate the emission area EMA of the corresponding subpixel SPXn and the subarea SA of the neighboring subpixel SPXn that is adjacent to the corresponding subpixel SPXn in the first direction DR1. The first and second bank parts BP1 and BP2 may be spaced from each other in the first direction DR1 by an emission area EMA or a subarea SA.

The bank parts BP may be the same distance apart from the bank protrusion portions (P1 and P2) of the outer banks EBN. In one example, the first bank part BP1 may be the same distance apart from a pair of adjacent first bank protrusion portions P1, and the second bank part BP2 may be the same distance apart from a pair of adjacent second bank protrusion portions P2. The centers of the first and second bank parts BP1 and BP2 may be parallel to an imaginary line that passes through the center of each of the subpixels SPXn along the first direction DR1.

However, the layout of the bank parts BP is not particularly limited. The layout and the number of bank parts BP in each of the subpixels SPXn may be associated with the layout of electrodes RME that will hereinafter be described. A plurality of electrodes RME may be disposed in and across the emission area EMA and the subarea SA of each of the subpixels SPXn through the bank parts BP and the bank protrusion portions (P1 and P2) of the outer banks EBN. The layout and the number of bank parts BP may vary depending on the shape of the electrodes RME. In one example, as illustrated in FIGS. 2-4, two electrodes RME may be disposed in each of the subpixels SPXn, in which case, one first bank part BP1 and one second bank part BP2 may be disposed in each of the subpixels SPXn, between the emission area EMA and the subarea SA of the corresponding subpixel SPXn or between the emission area EMA of the corresponding subpixel SPXn and the subarea SA of the neighboring subpixel SPXn that is adjacent to the corresponding subpixel SPXn in the first direction DR1. As the bank parts BP are spaced from the bank protrusion portions (P1 and P2), two paths may be formed between the bank parts BP and the bank protrusion portions (P1 and P2), and the two electrodes RME may be disposed in the spaces formed by the bank parts BP and the bank protrusion portions (P1 and P2). In some embodiments, the display device 10 may include more than two electrodes RME (e.g., RME1 and RME2) in each of the subpixels SPXn and may include more than two bank parts BP (e.g., BP1 and BP2) accordingly. This will be described later.

The inner banks IBN, the outer banks EBN, and the bank parts BP of the bank layer BNL may protrude at least in part from the top surface of the via layer VIA. Parts of the bank layer BNL that protrude may have each inclined or curved side surfaces. Alternatively, each of the elements of the bank layer BNL may have a semicircular or semielliptical shape in a cross-sectional view. The bank layer BNL may include an organic insulating material such as PI, but the present disclosure is not limited thereto.

The inner banks IBN, the outer banks EBN, and the bank parts BP may be disposed on the via layer VIA and may be formed at the same time by a single process. The inner banks IBN, the outer banks EBN, and the bank parts BP may be formed of the same material and may have the same shape in a cross-sectional view. That is, the inner banks IBN, the outer banks EBN, and the bank parts BP may be formed by the same process and may be distinguished from one another by their locations and shapes in a plan view.

The outer banks EBN and the bank parts BP may be disposed to surround the emission area EMA and the subarea SA of each of the subpixels SPXn and may separate the subpixels SPXn. The inner banks IBN may be disposed in the emission area EMA of each of the subpixels SPXn and may form a space in which light-emitting elements ED are to be disposed. The inner banks IBN, the outer banks EBN, and the bank parts BP may have the same height. However, the inner banks IBN, the outer banks EBN, and the bank parts BP may perform different functions. The outer banks EBN and the bank parts BP may prevent ink from spilling over between adjacent subpixels SPXn during inkjet printing, and different groups of light-emitting elements ED may be disposed in different subpixels SPXn. Light-emitting elements ED may be disposed in the gap between the inner banks IBN, and light emitted from the light-emitting elements ED may be reflected by the electrodes RME on the inner banks IBN and may thus be emitted upwardly (i.e., in the third direction DR3) from the via layer VIA. Because the inner banks IBN, the outer banks EBN, and the bank parts BP, which have different locations and perform different functions, are formed by the same process, the amount of time that it takes to fabricate the display device 10 can be simplified.

A plurality of electrodes RME may be disposed in each of the subpixels SPXn to extend in one direction. The electrodes RME may extend in the first direction DR1 to be disposed in and across the emission area EMA and the subarea SA of each of the subpixels SPXn and may be spaced from each other in the second direction DR2. The display device 10 may include, in each of the subpixels SPXn, first and second electrodes RME1 and RME2. The first electrode RME1 may be disposed on the left side of the center of the emission area EMA of each of the subpixels SPXn, and the second electrode RME2 may be spaced from the first electrode RME1 in the second direction DR2 and may be disposed on the right side of the center of each of the subpixels SPXn.

Part of the first electrode RME1 may be disposed on a first inner bank IBN1, and part of the second electrode RME2 may be disposed on a second inner bank IBN2. The electrodes RME may be disposed on inclined side surfaces of the inner banks IBN. In one example, the width, in the second direction DR2, of the electrodes RME may be smaller than the width, in the second direction DR2, of the inner banks IBN. The electrodes RME may be disposed to cover at least one side surface of each of the inner banks IBN and thus to reflect light emitted from the light-emitting elements ED. The distance, in the second direction DR2, between the electrodes RME may be smaller than the distance, in the second direction DR2, between the inner banks IBN. The electrodes RME may be disposed, at least in part, directly on the via layer VIA and may thus fall on the same plane.

In one example, the electrodes RME may extend in the first direction DR1 in the emission area EMA of each of the subpixels SPXn and may be bent in the second direction DR2 and then back in the first direction DR1 in a region adjacent to the bank parts BP. The electrodes RME may be disposed in and across the emission area EMA and the subarea SA of each of the subpixels SPXn. The electrodes RME, which include parts that extend in one direction (i.e., the first direction DR1), may be bent in the second direction DR2 and then back in the first direction DR1 depending on the layout and the locations of the bank parts BP and the bank protrusion portions (P1 and P2) between the emission area EMA and the subarea SA of each of the subpixels SPXn.

In one example, in each of the subpixels SPXn, first and second electrodes RME1 and RME2 may be disposed in part on first and second inner banks IBN1 and IBN2, respectively, and parts of the first and second electrodes RME1 and RME2 disposed on the inner banks IBN may extend in the first direction DR1. On the contrary, parts of the first and second electrodes RME1 and RME2 spaced from the bank protrusion portions (P1 and P2) of the outer banks EBN and the bank parts BP may not be parallel to the inner banks IBN in the first direction DR1. The distance between the bank protrusion portions (P1 and P2) of the outer banks EBN may be greater than the distance between the inner banks IBN, and the bank parts BP may be disposed on either side, in the first direction DR1, of the parts of the electrodes RME disposed on the inner banks IBN. The electrodes RME may include parts that are bent in the second direction DR2 and then back in the first direction DR1 and may be disposed in and across the emission area EMA and the subarea SA of each of the subpixels SPXn, bypassing the bank parts BP.

The distance, in the second direction DR2, between the electrodes RME may vary depending on the shape of the electrodes RME. The distance between the parts of the first and second electrodes RME1 and RME2 disposed on the inner banks IBN may be smaller than the parts of the first and second electrodes RME1 and RME2 bent to be disposed in and across the subarea SA of each of the subpixels SPXn. As will be described later, electrical signals may be applied to the electrodes RME so that an electric field may be generated, and the light-emitting elements ED may be disposed on the electrodes RME by the electric field generated between the first and second electrodes RME1 and RME2. A relatively strong electric field may be generated in regions where the distance between the electrodes RME is relatively small, and a relatively weak electric field may be generated in regions where the distance between the electrodes RME is relatively large. The light-emitting elements ED may receive a relatively strong force and may thus may be properly aligned in regions where a relatively strong electric field is generated. As the light-emitting elements ED can be properly arranged at a particular location in accordance with the shape of, and the distance between, the electrodes RME, the degree of alignment of the light-emitting elements ED can be improved.

The first and second electrodes RME1 and RME2 may be connected to the third conductive layer through first and second electrode contact holes CTD and CTS, respectively, which are formed in regions where the first bank protrusion portions P1 and the first bank part BP1 are spaced from each other. The first electrode RME1 may be in contact with the second electrode pattern CDP2 through the first electrode contact hole CTD that penetrates the via layer VIA. The first and second contact holes CTD and CTS may be spaced from each other in the second direction DR2 by the first bank part BP1 therebetween. The second electrode RME2 may be in contact with the second voltage line VL2 through the second electrode contact hole CTS that penetrates the via layer VIA.

The first electrode RME1 may be electrically connected to the first transistor T1 via the first and second electrode patterns CDP1 and CDP2 so that the first power supply voltage may be applied to the first electrode RME1, and the second electrode RME2 may be electrically connected to the second voltage line VL2 so that the second power supply voltage may be applied to the second electrode RME2. The distances between, and the layout of, the first bank part BP1 and the first bank protrusion portions P1 may vary depending not only on the layout and the number of electrodes RME, but also on the locations of the first and second electrode contact holes CTD and CTS, which are connected to the conductive layers below the via layer VIA.

In the separation part ROP of the subarea SA of each of the subpixels SPXn, the electrodes RME may be separated from electrodes RME of the neighboring subpixel SPXn that is adjacent to the corresponding subpixel SPXn in the first direction DR1. This type of arrangement of the electrodes RME may be obtained by initially forming the electrodes RME as single electrode lines that extend in the first direction DR1 and cutting the electrode lines after the arrangement of the light-emitting elements ED. The electrode lines may be used to generate an electric field in each of the subpixels SPXn to align the light-emitting elements ED during the fabrication of the display device 10. Once the light-emitting elements ED are aligned, the electrode lines may be cut in the separation part ROP of each of the subpixels SPXn, thereby forming the electrodes RME that are spaced from each other in the first direction DR1.

The electrodes RME may be electrically connected to the light-emitting elements ED. The electrodes RME may be connected to the light-emitting elements ED via the connecting electrodes CNE and may transmit electrical signals applied thereto from the conductive layers below the via layer VIA to the light-emitting elements ED.

The electrodes RME may include a conductive material with high reflectance. In one example, the electrodes RME may include a material with high reflectance, for example, a metal such as silver (Ag), Cu, or Al or an alloy of Al, Ni, or lanthanum (La). The electrodes RME may upwardly reflect light emitted by the light-emitting elements ED and then traveling toward the side surfaces of the inner bank IBN.

However, the present disclosure is not limited to this. Alternatively, the electrodes RME may further include a transparent conductive material. In one example, the electrodes RME may include a material such as ITO, IZO, or ITZO. In some embodiments, the electrodes RME may be formed as a stack of more than one layer of a transparent conductive material and more than one metal layer with high reflectance or as single layers including a transparent conductive material and a metal with high reflectance. In one example, the electrodes RME may have a stack of ITO/Ag/ITO/, ITO/Ag/IZO, or ITO/Ag/ITZO/IZO.

A first insulating layer PAS1 is disposed on the via layer VIA, the inner banks IBN, and the electrodes RME. The first insulating layer PAS1 may be disposed on the via layer VIA to cover the inner banks IBN and the electrodes RME, but not cover the outer banks EBN and the bank parts BP. The first insulating layer PAS1 may not be disposed in a region where the electrodes RME of each of the subpixels SPXn are spaced from the electrodes RME of the neighboring subpixel SPXn that is adjacent to the corresponding subpixel SPXn in the first direction DR1. In one example, the first insulating layer PAS1 may be disposed on the via layer VIA, in the entire emission area EMA and the entire subarea SA of each of the subpixels SPXn, except for the separation part ROP where the electrodes RME of each of the subpixels SPXn are spaced from the electrodes RME of the neighboring subpixel SPXn that is adjacent to the corresponding subpixel SPXn in the first direction DR1, and may be spaced from the outer banks EBN and the bank parts BP. The first insulating layer PAS1 may be formed after the formation of the outer banks EBN and the bank parts BP and may be disposed to cover the electrodes RME mostly, but not cover the outer banks EBN and the bank parts BP. The first insulating layer PAS1 may protect and insulate the electrodes RME. The first insulating layer PAS1 may prevent the light-emitting elements ED, which are disposed on the first insulating layer PAS1, from being placed in contact with, and damaged by, other elements.

In one example, the first insulating layer PAS1 may be formed to be recessed in part between electrodes RME that are spaced from each other in the second direction DR2. The light-emitting elements ED may be disposed on the top surface of part of the first insulating layer PAS1 that is recessed, and space may be formed between the light-emitting elements ED and the first insulating layer PAS1.

The first insulating layer PAS1 may include the contacts (CT1 and CT2) that expose parts of the top surfaces of the electrodes RME. The contacts (CT1 and CT2) may penetrate the first insulating layer PAS1, and the connecting electrodes CNE that will be described later may be in contact with parts of the electrodes RME exposed by the contacts (CT1 and CT2).

The light-emitting elements ED may be disposed on the first insulating layer PAS1. Each of the light-emitting elements ED may include a plurality of layers that are arranged in a direction parallel to the top surface of the first substrate SUB. The light-emitting elements ED may be arranged such that a direction in which the light-emitting elements ED extend may be parallel to the first substrate SUB, and the semiconductor layers included in each of the light-emitting elements ED may be sequentially arranged in a direction parallel to the top surface of the first substrate SUB. However, the present disclosure is not limited to this. Alternatively, the plurality of layers included in each of the light-emitting elements ED may be arranged in a direction perpendicular to the first substrate SUB.

The light-emitting elements ED may be disposed on the electrodes RME that are spaced from each other in the second direction DR2, between the inner banks IBN. The light-emitting elements ED may be disposed to be spaced from one another in the direction in which the electrodes RME extend, i.e., in the first direction DR1, and may be aligned substantially in parallel to one another. The light-emitting elements ED may extend in one direction (i.e., the second direction DR2), and the length of the light-emitting elements ED may be greater than the minimum distance between the electrodes RME that are spaced from each other in the second direction DR2. At least one end portion of each of the light-emitting elements ED may be disposed on one of the electrodes RME, or both end portions of each of the light-emitting elements ED may be disposed on different electrodes RME (e.g., RME1 and RME2). The direction in which the electrodes RME extend and the direction in which the light-emitting elements ED extend may be substantially perpendicular to each other, but the present disclosure is not limited thereto. Alternatively, the light-emitting elements ED may be arranged at an inclination with respect to the direction in which the electrodes RME extend.

Each of the light-emitting elements ED may include a plurality of semiconductor layers, and the light-emitting elements ED may emit light of different wavelength ranges depending on the materials of their semiconductor layers.

However, the present disclosure is not limited to this. Alternatively, the light-emitting elements ED may include semiconductor layers of the same materials and may thus emit light of the same color. Also, each of the light-emitting elements ED may include semiconductor layers that are doped with dopants of different conductivity types and may be aligned such that one end portion thereof may be oriented in a particular direction by an electric field formed on the electrodes RME. First and second end portions of each of the light-emitting elements ED may be defined based on one semiconductor layer included in each of the light-emitting elements ED. In one example, end portions of the light-emitting elements ED disposed on the first electrode RME1 may be first end portions, and end portions of the light-emitting elements ED disposed on the second electrode RME2 may be second end portions. However, the present disclosure is not limited to this example. In an example, the light-emitting elements ED may be disposed not to overlap with the electrodes RME. In this example, end portions of the light-emitting elements ED adjacent to the first electrode RME1 may be first end portions, and end portions of the light-emitting elements adjacent to the second electrode RME2 may be second end portions. In an embodiment where the display device 10 includes more than two electrodes RME in each of the subpixels SPXn, the direction faced by the first end portions of the light-emitting elements ED may differ on different electrodes RME.

The light-emitting elements ED may be in contact with, and electrically connected to, the connecting electrodes CNE. As some of the semiconductor layers included in each of the light-emitting elements ED are exposed at both ends, in the length direction, of each of the light-emitting elements ED, the exposed semiconductor layers may be in contact with the connecting electrodes CNE. The light-emitting elements ED may be electrically connected to the conductive layers below the via layer VIA, and electrical signals may be applied to the light-emitting elements ED so that the light-emitting elements ED may emit light of a particular wavelength range.

A second insulating layer PAS2 may be disposed on the light-emitting elements ED. In one example, the second insulating layer PAS2 may be disposed to cover parts of the outer surfaces of the light-emitting elements ED, but not cover both sides or both ends of each of the light-emitting elements ED. The second insulating layer PAS2 may protect and fix the light-emitting elements ED during the fabrication of the display device 10. Also, the second insulating layer PAS2 may be disposed to fill the space between the light-emitting elements ED and the first insulating layer PAS1.

In one example, the second insulating layer PAS2 may include parts that are disposed on the light-emitting elements ED and may further include parts that are disposed between the inner banks IBN, the outer banks EBN, and the bank parts BP or between the outer banks EBN and the bank parts BP. In each of the subpixels SPXn, there may arise height differences between regions where the inner banks IBN and the outer banks EBN of the bank layer BNL and the bank parts BP are disposed and regions where the inner banks IBN and the outer banks EBN of the bank layer BNL and the bank parts BP are not disposed. Layers may be disposed on the bank layer BNL along the height differences in the bank layer BNL, and if the layers on the bank layer BNL are thin, parts of the layers on the bank layer BNL may remain even after patterning for forming the layers on the bank layer BNL, due to the height differences in the bank layer BNL. The connecting electrodes CNE, in some embodiments, may be disposed in and across the emission area EMA and the subarea SA of each of the subpixels SPXn and across the bank protrusion portions (P1 and P2) of the outer banks EBN or the bank parts BP. Recesses where the bank layer BNL is not disposed may be formed between the bank parts BP and the inner banks IBN, and the second insulating layer PAS2 may be disposed to fill the recesses and thus to compensate for the height differences in the bank layer BNL.

In one example, the second insulating layer PAS2 may include a first pattern portion PT1 that is disposed between the inner banks IBN, a plurality of second pattern portions PT2 that are disposed between the first bank part BP1 and the bank protrusion portions (P1 and P2) of the outer banks EBN, and a third pattern portion PT3 that connects the first pattern portion PT1 and the second pattern portions PT2 and is disposed between the inner banks IBN and the first bank part BP1.

The first pattern portion PT1 may extend in the first direction DR1 between the first and second inner banks IBN1 and IBN2 and may cover the light-emitting elements ED. The first pattern portion PT1 may be disposed on the first insulating layer PAS1 to extend in the first direction DR1 in a plan view and may thus form a linear or island pattern in each of the subpixels SPXn. Also, the first pattern portion PT1 may fill the space between the light-emitting elements ED and the first insulating layer PAS1 or may be disposed to surround, and thereby protect and fix, the light-emitting elements ED.

The second pattern portions PT2 may be disposed between the emission area and the subarea SA of each of the subpixels SPXn. The second pattern portions PT2 may be disposed to fill the gaps between the first bank part BP1 and the first bank protrusion portions P1 of the outer banks EBN and compensate for the height difference between the first bank part BP1 and the first bank protrusion portions P1. In one example, both side surfaces of each of the second pattern portions PT2 of the second insulating layer PAS2 may be in contact with the first bank part BP1 and the first bank protrusion portions P1. As will be described later, the second insulating layer PAS2 may include an organic insulating material and may be formed by applying and patterning an organic insulating material during the fabrication of the display device 10. As the organic insulating material can fill the regions, in each of the subpixels SPXn, where the bank layer BNL is not disposed, the second insulating layer PAS2 may be disposed to be in direct contact with the elements of the bank layer BNL to compensate for the height differences in the bank layer BNL.

In some embodiments, the height from the via layer VIA to the top surfaces of the second pattern portions PT2 may be the same as the height from the via layer VIA to the top surfaces of the bank protrusion portions (P1 and P2) of the outer banks EBN and the top surfaces of the bank parts BP. The second insulating layer PAS2, which includes an organic insulating material, may form a flat top surface during patterning, regardless of the underlying height differences. In a case where the organic insulating material is applied to have the same height as the elements of the bank layer BNL, part of the second insulating layer PAS2 disposed directly on the first insulating layer PAS1 may have the same height from the via layer VIA as the outer banks EBN and the bank parts BP, even if the height of the second insulating layer PAS2 is actually smaller than the height of the outer banks EBN and the bank parts BP. Similarly, the height of the top surface of the first pattern portion PT1 of the second insulating layer PAS2, which is disposed on the light-emitting elements ED, may be at the same level as the height of the top surfaces of the inner banks IBN. However, as the first pattern portion PT1 is disposed to surround the light-emitting elements ED, the first pattern portion PT1 may be thinner on the light-emitting elements ED than elsewhere.

The second pattern portions PT2 of the second insulating layer PAS2 may overlap with the first and second electrode contact holes CTD and CTS in the thickness direction (i.e., the third direction DR3). The second pattern portions PT2 of the second insulating layer PAS2 may cover the electrodes RME and the first insulating layer PAS1 that are disposed above the first and second electrode contact holes CTD and CTS. As the connecting electrodes CNE are spaced from the first and second electrode contact holes CTD and CTS by the second insulating layer PAS2, the parasitic capacitance between the connecting electrodes CNE and the electrodes RME or between the connecting electrodes CNE and the conductive layers connected through the first and second electrode contact holes CTD and CTS can be reduced.

The third pattern portion PT3 may connect the first pattern portion PT1 and the second pattern portions PT2 and may be disposed in the emission area EMA of each of the subpixels SPXn. The third pattern portion PT3 may extend in the second direction DR2 and may be disposed on first sides, in the first direction DR1, of the inner banks IBN, for example, on the upper sides of the inner banks IBN, between the first bank part BP1 and the inner banks IBN. In one example, the third pattern portion PT3 may be in part in contact with the first bank part BP1 and may compensate for the height difference between the inner banks IBN and the first bank part BP1 or between the inner banks IBN and the bank protrusion portions (P1 and P2) of the outer banks EBN. The inner banks IBN may be disposed to be spaced from the bank protrusion portions (P1 and P2) of the outer banks EBN and the bank parts BP in the first direction DR1, in the middle of the emission area EMA of each of the subpixels SPXn. As the elements of the bank layer BNL are formed to have a desired height (e.g., a set or predetermined height), only the first insulating layer PAS1 may be disposed between the inner banks IBN and the bank parts BP to have a relatively small height. As the third pattern portion PT3 is disposed to adjoin the inner banks IBN and the first bank part BP1 in a plan view, on the inside of the emission area EMA of each of the subpixels SPXn from the first bank part BP1, the third pattern portion PT3 may fill the gap between parts of the first bank part BP1 (for example, see, FIG. 7) and the inner banks IBN.

The connecting electrodes CNE may be disposed in and across the emission area EMA and the subarea SA of each of the subpixels SPXn over the first bank part BP1 and may extend in the first direction DR1, on the electrodes RME. The connecting electrodes CNE may extend from the inner banks IBN in the first direction DR1 and may be disposed across the third pattern portion PT3 and the first bank part BP1 and may be placed on the flat top surface formed by the inner banks IBN, the first bank part BP1, and the third pattern portion PT3. As the connecting electrodes CNE are disposed in regions where the height differences in the bank layer BNL are compensated for by the second insulating layer PAS2, parts of the connecting electrodes CNE may not remain after patterning even if the connecting electrodes CNE are formed to be thin. As the second insulating layer PAS2 compensates for the height differences in the bank element BNL, a short circuit that may occur due to any residues of the connecting electrodes CNE being connected to each other can be prevented.

A plurality of connecting electrodes CNE may be disposed on the second insulating layer PAS2.

The connecting electrodes CNE may be disposed on the light-emitting elements ED, the electrodes RME, and the second insulating layer PAS2. The connecting electrodes CNE may be disposed in part on the second insulating layer PAS2 and may be spaced from each other in the second direction DR2, over the second insulating layer PAS2. The connecting electrodes CNE may be in contact with the light-emitting elements ED and the electrodes RME. The connecting electrodes CNE may be in direct contact with the semiconductor layers disposed at both ends of each of the light-emitting elements ED and may be in contact with at least one of the electrodes RME through the contacts (CT1 and CT2). Both end portions of each of the light-emitting elements ED may be electrically connected to the electrodes RME via the connecting electrodes CNE.

A first connecting electrode CNE1 may extend in the first direction DR1 and may be disposed on the first electrode RME1. Part of the first connecting electrode CNE1 disposed on the first inner bank IBN1 may overlap with the first electrode RME1, and the first connecting electrode CNE1 may extend in the first direction DR1 from its part overlapping with the first electrode RME1 and may thus be disposed even in the subarea SA of each of the subpixels SPXn beyond the third pattern portion PT3 of the second insulating layer PAS2 and the first bank part BP1. The first connecting electrode CNE1 may include a part that is bent in the second direction DR2, in the subarea SA of each of the subpixels SPXn, and the bent part of the first connecting electrode CNE1 may be in contact with the first electrode RME1 through a first contact CT1 that exposes the top surface of the first electrode RME1. The first connecting electrode CNE1 may be in contact with the first end portions of the light-emitting elements ED and the first electrode RME1 and may thus transmit an electrical signal applied thereto by the first transistor T1 to the light-emitting elements ED.

A second connecting electrode CNE2 may extend in the first direction DR1 and may be disposed on the second electrode RME2. Part of the second connecting electrode CNE2 disposed on the second inner bank IBN2 may overlap with the second electrode RME2, and the second connecting electrode CNE2 may extend in the first direction DR1 from its part overlapping with the second electrode RME2 and may thus be disposed even in the subarea SA of each of the subpixels SPXn beyond the third pattern portion PT3 of the second insulating layer PAS2 and the first bank part BP1. The second connecting electrode CNE2 may include a part that is bent in the second direction DR2, in the subarea SA of each of the subpixels SPXn, and the bent part of the second connecting electrode CNE2 may be in contact with the second electrode RME2 through a second contact CT2 that exposes the top surface of the second electrode RME2. The second connecting electrode CNE2 may be in contact with the second end portions of the light-emitting elements ED and the second electrode RME2 and may thus transmit an electrical signal applied thereto by the second voltage line VL2 to the light-emitting elements ED.

The connecting electrodes CNE may be bent in the second direction DR2 in regions where the contacts (CT1 and CT2) are disposed and may be disposed to overlap with the electrodes RME. The connecting electrodes CNE may be in contact with the electrodes RME through the contacts (CT1 and CT2) that penetrate the first insulating layer PAS1. In one example, the contacts (CT1 and CT2) may be formed to be spaced, in the first direction DR1, from a region where the light-emitting elements ED are disposed and thus not to overlap with the light-emitting elements ED in the second direction DR2. The contacts (CT1 and CT2) are illustrated as being disposed in the subarea SA of each of the subpixels SPXn, but the present disclosure is not limited thereto. Alternatively, the contacts (CT1 and CT2) may be formed in regions where the light-emitting elements ED are not disposed, in the emission area EMA of each of the subpixels SPXn.

The first and second connecting electrodes CNE1 and CNE2 may be disposed to be spaced from each other in the second direction DR2. The first and second connecting electrodes CNE1 and CNE2 may be disposed not to be in direct contact with each other, and electrical signals applied to the connecting electrodes CNE may flow through the light-emitting elements ED.

As already mentioned above, the third pattern portion PT3 may be in direct contact with the first bank part BP1 and may thus compensate for the height difference between the first bank part BP1 and the inner banks IBN. The connecting electrodes CNE may be disposed in and across the emission area EMA and the subarea SA of each of the subpixels SPXn and may be disposed on the third pattern portion PT3 of the second insulating layer PAS2, in the emission area EMA of each of the subpixels SPXn. As the connecting electrodes CNE are disposed on a flat surface, almost no residues may remain after patterning. Accordingly, the connecting electrodes CNE, which are spaced from each other in the second direction DR2, can be prevented from being short-circuited by any residues remained therebetween.

The first and second connecting electrodes CNE1 and CNE2 are illustrated as being spaced from each other on the second insulating layer PAS2 and being placed in substantially the same layer, but the present disclosure is not limited thereto. Alternatively, the first and second connecting electrodes CNE1 and CNE2 may be disposed in different layers, and an insulating layer may be further disposed between the first and second connecting electrodes CNE1 and CNE2.

The connecting electrodes CNE may include a conductive material. In one example, the connecting electrodes CNE may include ITO, IZO, ITZO, or Al. The connecting electrodes CNE may include, for example, a transparent conductive material, and light emitted from the light-emitting elements ED may travel toward the electrodes RME through the connecting electrodes CNE. However, the present disclosure is not limited to this.

Although not specifically illustrated, an additional insulating layer may be further disposed on the second insulating layer PAS2, the connecting electrodes CNE, and the outer banks EBN. The additional insulating layer may protect the elements disposed on the first substrate SUB from an external environment.

The first insulating layer PAS1 may include an inorganic insulating material or an organic insulating material, and the second insulating layer PAS2 may include an organic insulating material. However, the present disclosure is not limited to this.

Figure 8:
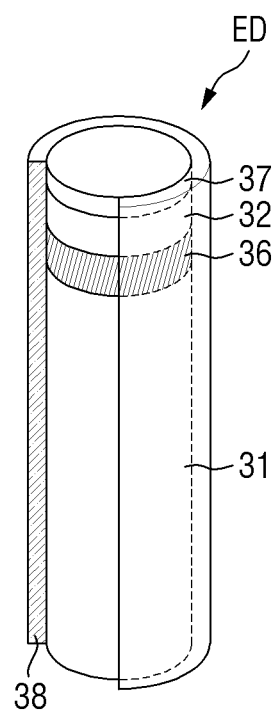
FIG. 8 is a perspective cutaway view of a light-emitting element according to an embodiment of the present disclosure.

FIG. 8 is a perspective cutaway view of a light-emitting element according to an embodiment of the present disclosure.

Referring to FIG. 8, a light-emitting element ED may be a light-emitting diode (LED), particularly, an ILED having a size of several nanometers or micrometers and formed of an inorganic material. If an electric field is formed in a particular direction between two opposite electrodes (e.g., RME1 and RME2), the light-emitting element ED may be aligned between the two electrodes where polarities are formed.

The light-emitting element ED may have a shape that extends in one direction. The light-emitting element ED may have the shape of a cylinder, a rod, a wire, or a tube, but the shape of the light-emitting element ED is not particularly limited. Alternatively, the light-emitting element ED may have the shape of a polygonal column such as a regular cube, a rectangular parallelepiped, or a hexagonal column or may have a shape that extends in one direction but with a partially inclined outer surface.

The light-emitting element ED may include semiconductor layers doped with impurities of an arbitrary conductivity type (e.g., a p type or an n type). The semiconductor layers may receive electrical signals from an external power source to emit light of a particular wavelength range. The light-emitting element ED may include a first semiconductor layer 31, a second semiconductor layer 32, the light-emitting layer 36, an electrode layer 37, and the insulating film 38.

The first semiconductor layer 31 may include an n-type semiconductor. The first semiconductor layer 31 may include a semiconductor material, i.e., $Al_xGa_yIn_{1-x-y}N$ (where $0 \leq x \leq 1$, $0 \leq y \leq 1$, and $0 \leq x+y \leq 1$). In one example, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, i.e., $Al_xGa_yIn_{1-x-y}N$ (where $0 \leq x \leq 1$, $0 \leq y \leq 1$, and $0 \leq x+y \leq 1$). In one example, the second semiconductor layer 32 may include at least one of AlGaInN, GaN, AlGaN, InGaN, AlN, and InN that are doped with a p-type dopant. The p-type dopant may be Mg, Zn, Ca, Se, or Ba.

FIG. 8 illustrates that the first and second semiconductor layers 31 and 32 are formed as single layers, but the present disclosure is not limited thereto. Alternatively, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. The light-emitting layer 36 may include a material such as AlGaN or AlGaInN. In particular, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN.

Alternatively, the light-emitting layer 36 may have a structure in which a semiconductor material having a large band gap energy and a semiconductor material having a small band gap energy are alternately stacked or may include Group-III or Group-V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be an ohmic connecting electrode, but the present disclosure is not limited thereto. Alternatively, the electrode layer 37 may be a Schottky connecting electrode. The light-emitting element ED may include at least one electrode layer 37. The light-emitting element ED may include more than one electrode layer 37, but the present disclosure is not limited thereto. Alternatively, the electrode layer 37 may not be provided.

The electrode layer 37 may reduce the resistance between the light-emitting element ED and electrodes RME or (connecting electrodes CNE) when the light-emitting element ED is electrically connected to the electrodes RME or (the connecting electrodes CNE). The electrode layer 37 may include a conductive metal. In one example, the electrode layer 37 may include at least one of Al, Ti, In, gold (Au), Ag, ITO, IZO, and ITZO.

The insulating film 38 may be disposed to surround the first and second semiconductor layers 31 and 32 and the electrode layer 37. For example, the insulating film 38 may be disposed to surround the outer surfaces (e.g., the outer peripheral or circumferential surfaces) of the first and second semiconductor layers 31 and 32 and the electrode layer 37. In one example, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the present disclosure is not limited thereto. Alternatively, in some embodiments, the insulating film 38 may be formed as a multilayer film in which multiple layers are stacked.

The insulating film 38 may protect the other elements of the light-emitting element ED. The insulating film 38 can prevent any short circuit that may occur in the light-emitting element 36 in case that the light-emitting element ED is in direct contact with electrodes to which electrical signals are applied. Also, the insulating film 38 can prevent the degradation of the emission efficiency of the light-emitting element ED.

The outer surface of the insulating film 38 may be subjected to surface treatment. The light-emitting element ED may be sprayed on electrodes while being dispersed in ink (e.g., in predetermined ink). Here, the surface of the insulating film 38 may be hydrophobically or hydrophilically treated to keep the light-emitting element ED dispersed in ink without agglomerating with other neighboring light-emitting elements ED.

FIGS. 9-16 are plan views or cross-sectional views illustrating how to fabricate the display device of FIG. 1. FIGS. 9-16 are plan views or cross-sectional views of a pixel PX or a subpixel SPXn of the display device 10 and illustrate the structure of the display device 10 in accordance with the order of formation of a bank layer BNL, electrodes RME, a first insulating layer PAS1, light-emitting elements ED, and a second insulating layer PAS2 in the subpixel SPXn. For example, FIGS. 9, 11, 13, and 15 are plan views of a pixel PX of the display device 10, and FIGS. 10, 12, 14, and 16 are cross-sectional views of a subpixel SPXn of the display device 10. FIGS. 10, 12, 14, and 16 are cross-sectional views taken along the lines A1-A1', A2-A2', A3-A3', and A4-A4', respectively, of FIGS. 9, 11, 13, and 15, respectively, and may all correspond to FIG. 5. Each layer of the semiconductor device 10 may be formed by a typical patterning process. Hereinafter, each process of the fabrication of the semiconductor device 10 will be briefly described, and the order of formation of each layer of the display device 10 will be described in detail.

Figure 9:
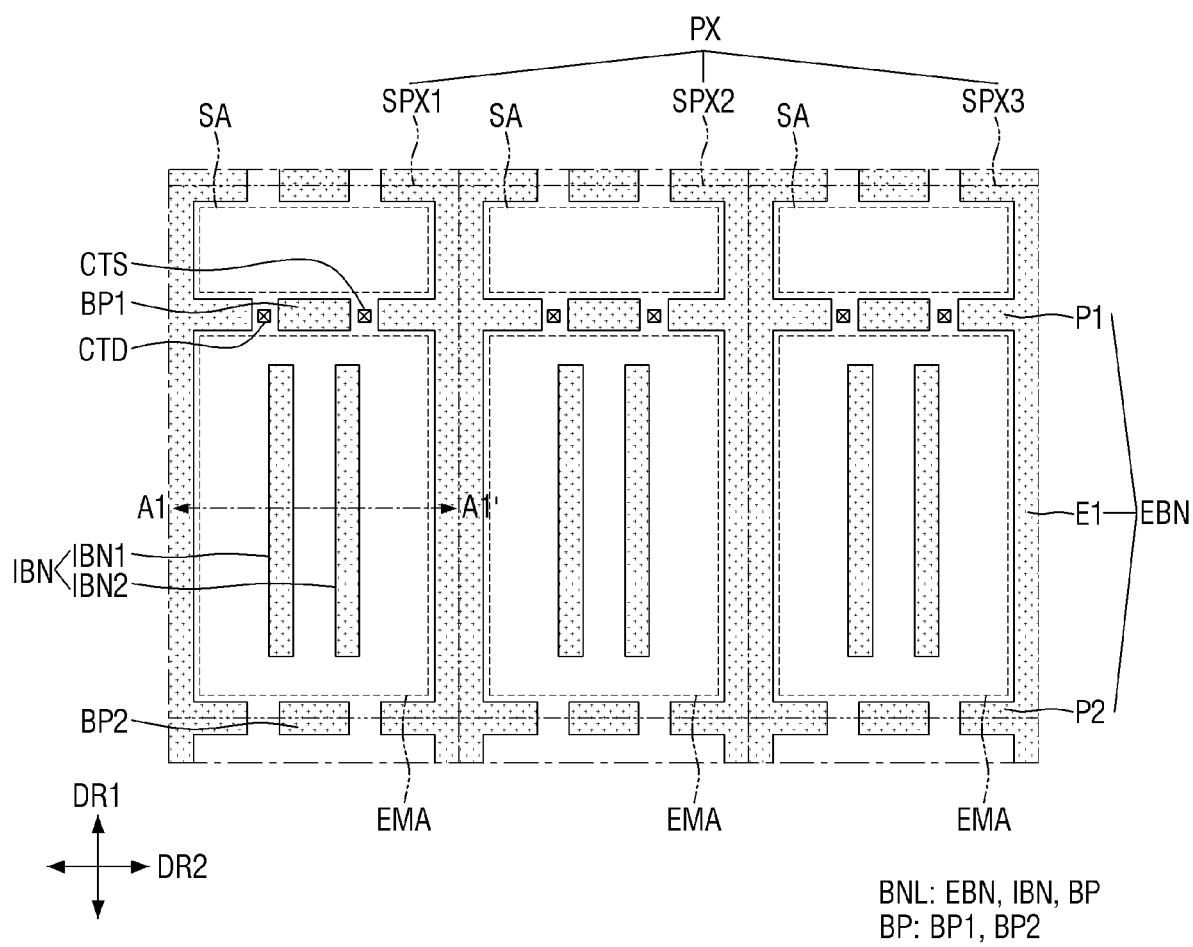
FIGS. 9-16 are plan views or cross-sectional views illustrating how to fabricate the display device of FIG. 1.
Figure 10:
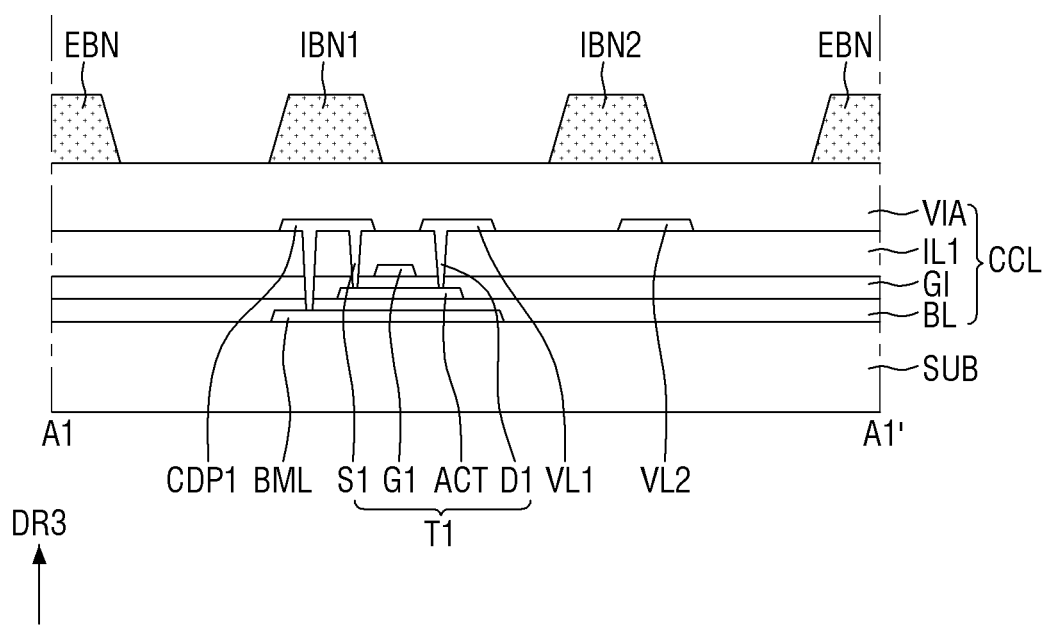

Referring to FIGS. 9 and 10, the first substrate SUB and a circuit layer CCL is prepared, and a bank layer BNL is formed on a via layer VIA. The bank layer BNL may include outer banks EBN, which are disposed along the boundaries of each of subpixels SPXn of a pixel PX, a plurality of bank parts BP, and inner banks IBN. The bank layer BNL may include an organic insulating material such as, for example, PI, and may be formed by exposure and development processes using a mask. Parts of the mask that are to be exposed may be determined in accordance with the locations of the inner banks IBN, the outer banks EBN, and the bank parts BP. The bank parts BP and the outer banks EBN may be spaced in the second direction DR2 between an emission area EMA and a subarea SA of each of the subpixels SPXn, and a first bank part BP1 and first bank protrusion portions P1 may be spaced by electrode contact holes (CTD and CTS) that penetrate the via layer VIA.

Figure 11:
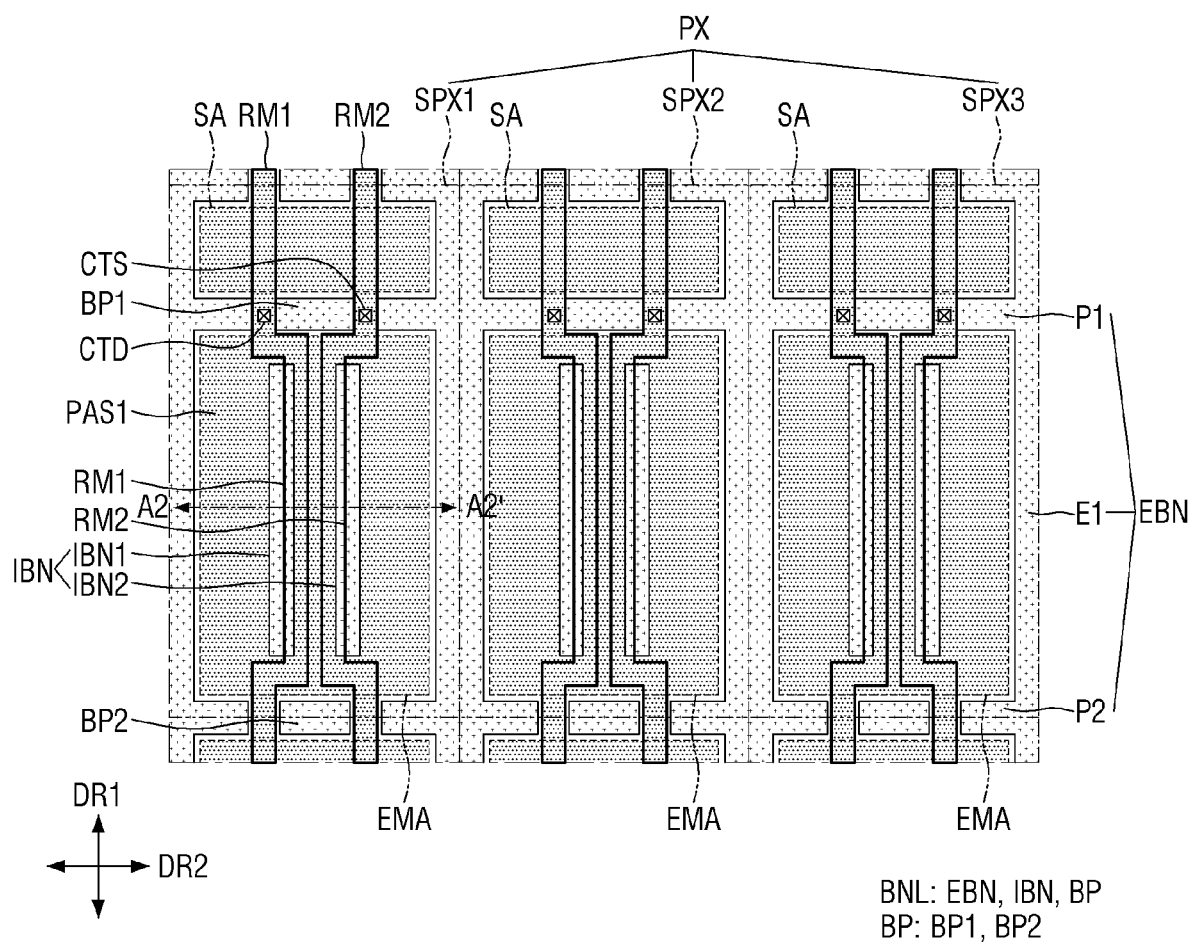
Figure 12:
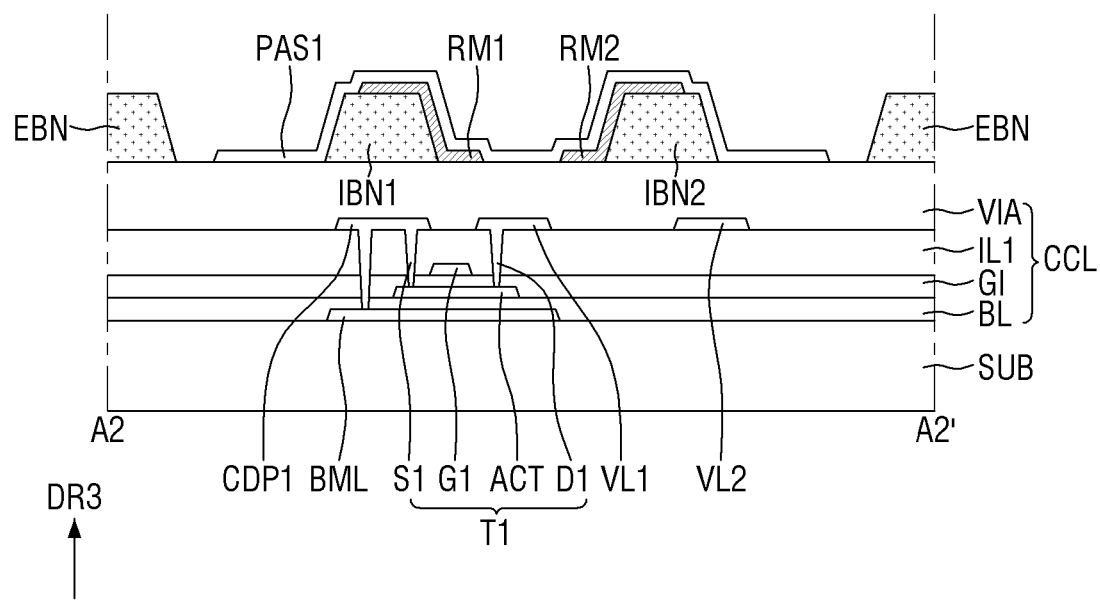

Thereafter, referring to FIGS. 11 and 12, a plurality of electrode lines (RM1 and RM2), which extend in the first direction DR1 across multiple subpixels SPXn that are arranged along the first direction DR1, and a first insulating layer PAS1, which is disposed on the electrode lines (RM1 and RM2), are formed. The electrode lines (RM1 and RM2) may include first and second electrode lines RM1 and RM2, which partially cover first and second inner banks IBN1 and IBN2, in the emission area EMA of each of the subpixels SPXn. The electrode lines (RM1 and RM2) may be disposed in and across the emission area EMA and the subarea SA of each of the subpixels SPXn through the gaps between bank protrusion portions (P1 and P2) of the outer banks EBN and bank parts (BP1 and BP2). Each of the electrode lines (RM1 and RM2) may be disposed across multiple subpixels SPXn that are adjacent to one another in the first direction DR1. The electrode lines (RM1 and RM2) may be used to generate an electric field for aligning light-emitting elements ED and may be divided in the subarea SA of each of the subpixels SPXn, thereby forming first and second electrodes RME1 and RME2 in each of the subpixels SPXn.

The first insulating layer PAS1 may be disposed on the entire surface of the via layer VIA, but not on the outer banks EBN, the bank parts BP and not in part of the subarea SA of each of the subpixels SPXn. The first insulating layer PAS1 may cover the electrode lines (RM1 and RM2) and the inner banks IBN and may be disposed even between the bank protrusion portions (P1 and P2) of the outer banks EBN and the bank parts BP. The first insulating layer PAS1 may be spaced from the outer banks EBN and the bank protrusion portions (P1 and P2).

Figure 13:
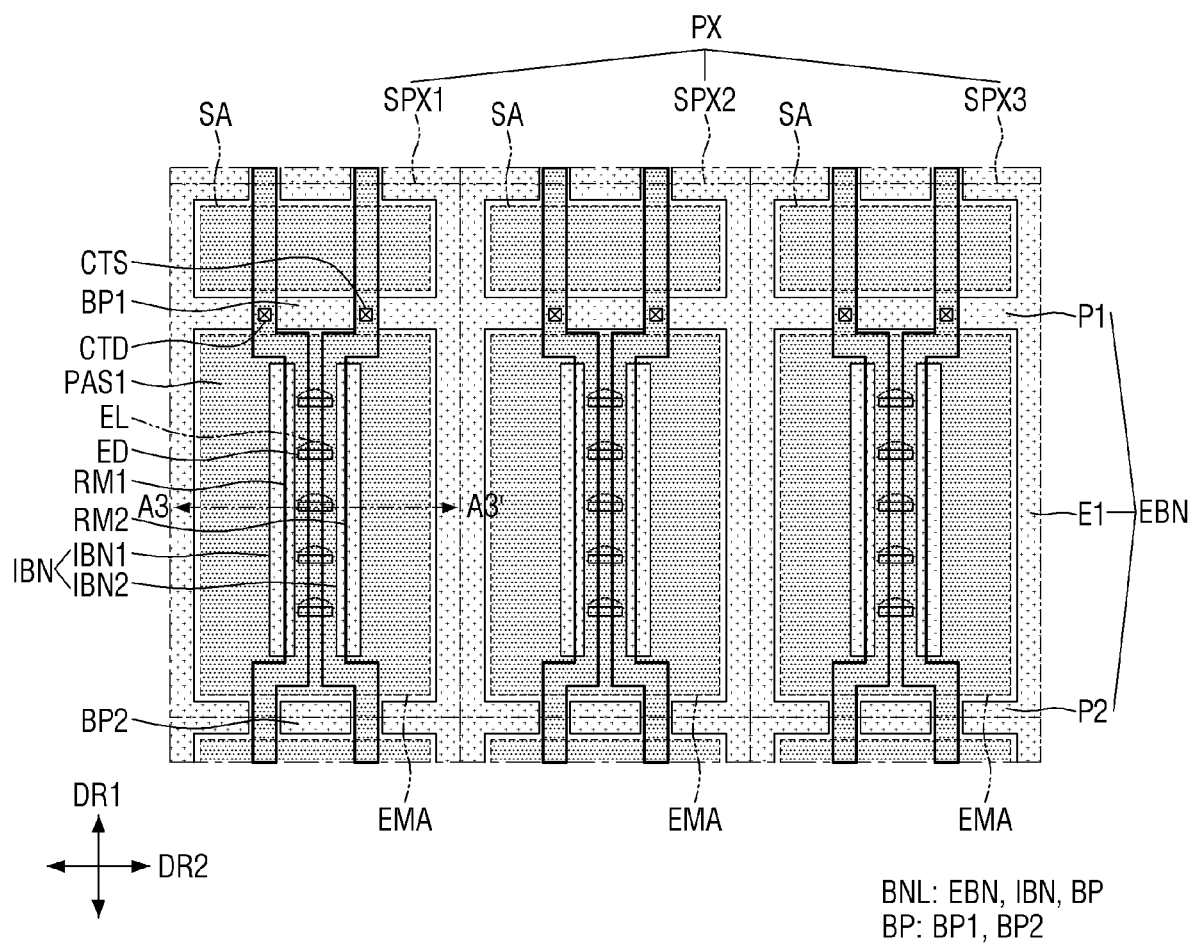
Figure 14:
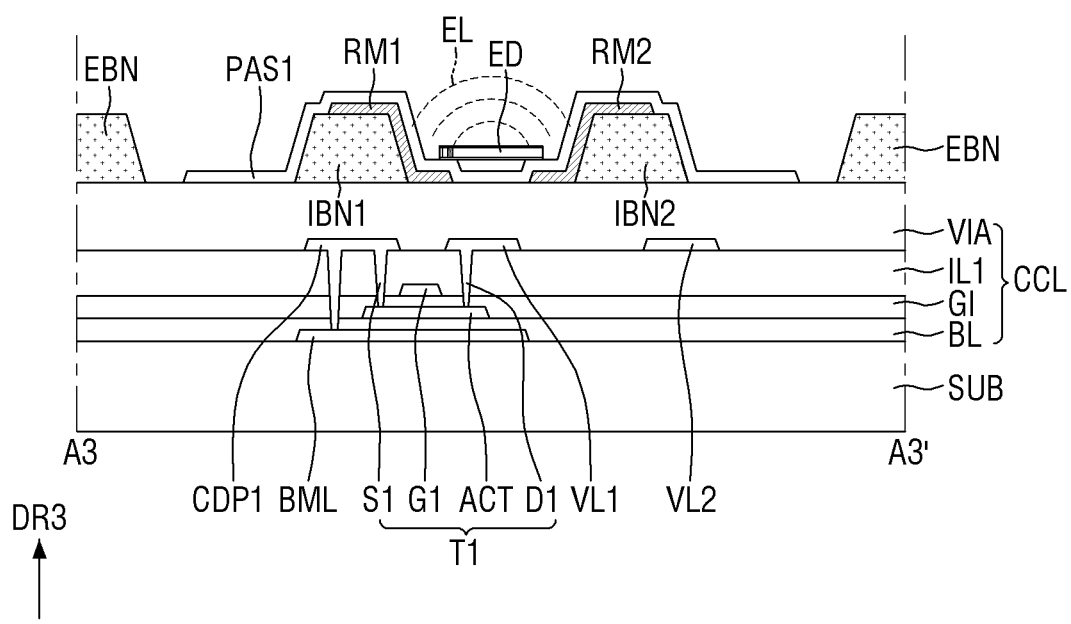

Thereafter, referring to FIGS. 13 and 14, light-emitting elements ED may be sprayed into the emission area EMA of each of the subpixels SPXn and may then be aligned by applying electrical signals to the first and second electrode lines RM1 and RM2. In one example, a plurality of light-emitting elements ED may be prepared in a state of being dispersed in ink and may then be sprayed into the emission area EMA of each of the subpixels SPXn. In response to electrical signals being applied to the first and second electrode lines RM1 and RM2, an electric field EL may be generated due to the difference in electric potential between the first and second electrode lines RM1 and RM2, and the light-emitting elements ED dispersed in the ink may receive a force from the electric field EL so that the location and the alignment direction of the light-emitting elements ED may change. As a result, the light-emitting elements ED may be disposed on the first and second electrode lines RM1 and RM2.

The electric field EL may be generated between the inner banks IBN (e.g., the electric field generated between the first and second electrode lines RM1 and RM2) by the electrical signals applied to the first and second electrode lines RM1 and RM2. The light-emitting elements ED may be aligned on the first and second electrode lines RM1 and RM2 by the electric field EL generated between the inner bank IBN (e.g., the electric field generated between the first and second electrode lines RM1 and RM2).

Figure 15:
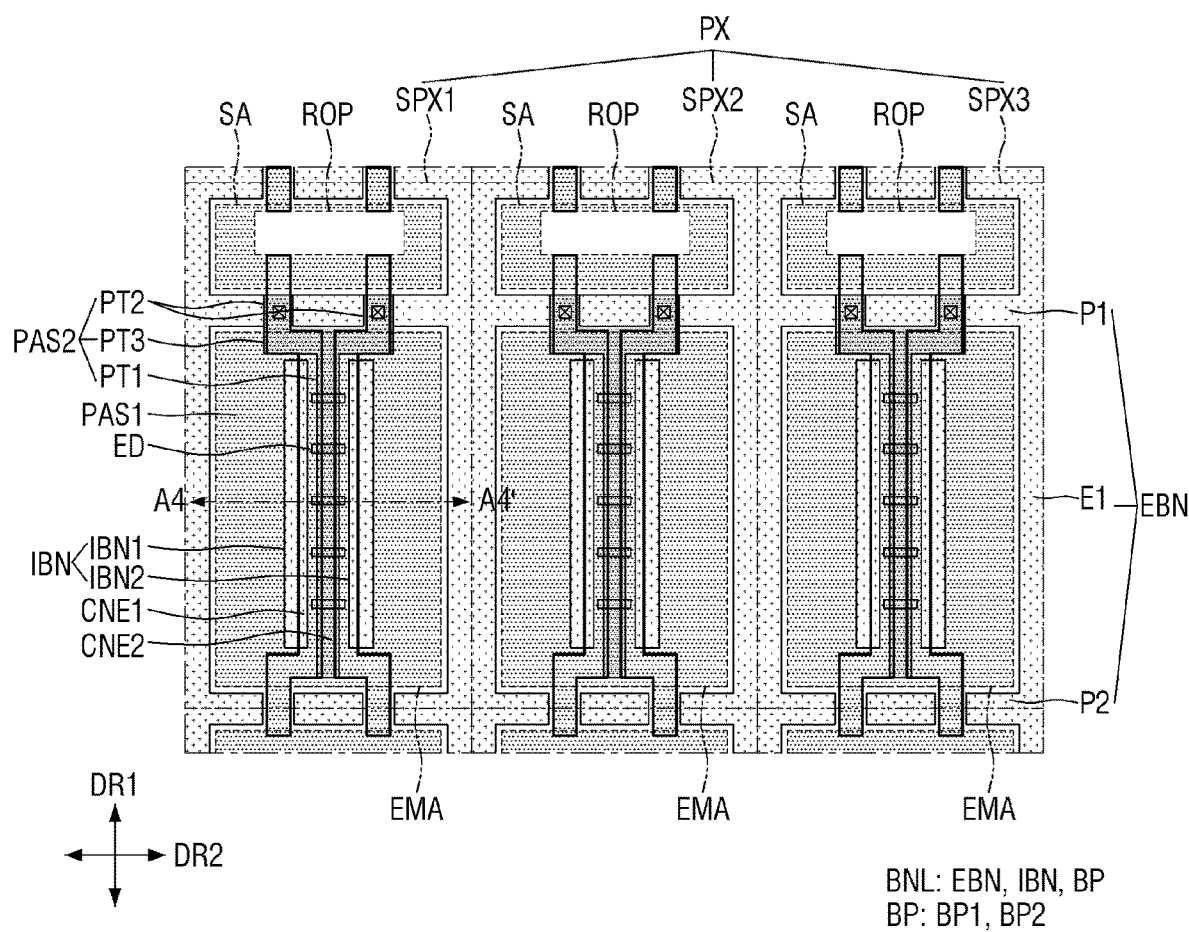
Figure 16:
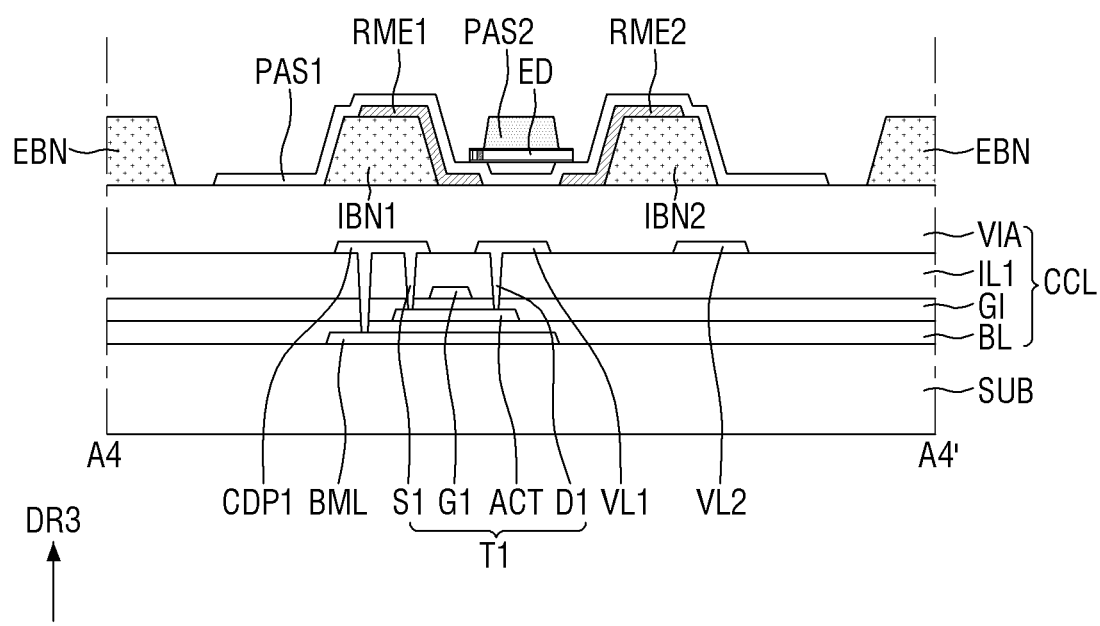

Thereafter, referring to FIGS. 15 and 16, a second insulating layer PAS2, which is disposed between the light-emitting elements ED and some of the elements of the bank layer BNL, is formed, and the electrode lines (RM1 and RM2) are divided in a separation part ROP of the subarea SA of each of the subpixels SPXn. The second insulating layer PAS2 may include first pattern portions PT1, which are disposed on the light-emitting elements ED, and may thus fix the light-emitting elements ED. Also, the second insulating layer PAS2 may include second pattern portions PT2 and a third pattern portion PT3 and may thus fill the gaps between the elements of the bank layer BNL and thus to compensate for height differences generated by the elements of the bank layer BNL.

The electrode lines (RM1 and RM2) may be divided in the separation part ROP of each of the subpixels SPXn where the first insulating layer PAS1 is not disposed and may form electrodes RME of each of the subpixels SPXn.

Thereafter, although not specifically illustrated, first and second connecting electrodes CNE1 and CNE2 may be formed on the second insulating layer PAS2, thereby obtaining the display device 10.

Display devices according to one or more embodiments of the present disclosure will hereinafter be described.

Figure 17:
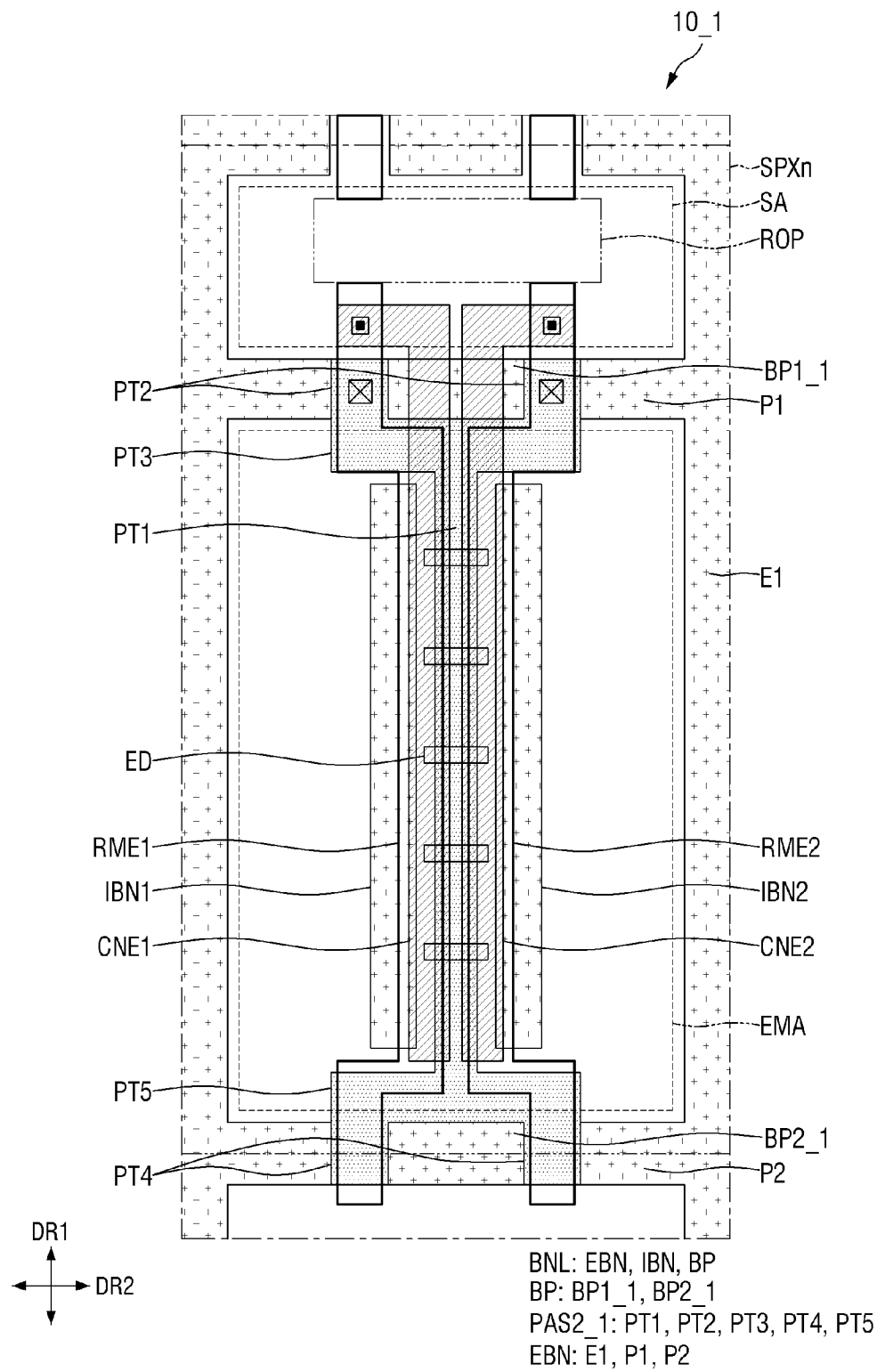
FIG. 17 is a plan view of a subpixel of a display device according to an embodiment of the present disclosure.

FIG. 17 is a plan view of a subpixel of a display device according to an embodiment of the present disclosure. FIG. 17 illustrates the layout of a bank layer BNL, electrodes RME, and a second insulating layer PAS2_1, but not the layout of a first insulating layer PAS1.

Referring to a display device 10_1 of FIG. 17, the second insulating layer PAS2_1 may be disposed between second bank protrusion portions P2 of outer banks EBN and a second bank part BP2_1. As the second insulating layer PAS2_1 is disposed to fill the gaps between the outer banks EBN and bank parts BP, height differences generated by bank protrusion portions (P1 and P2) of the outer banks EBN and the bank parts BP, between an emission area EMA and a subarea SA of a subpixel SPXn, can all be compensated for. The second insulating layer PAS2_1 may have a different shape from the second insulating layer PAS2 of FIG. 2.

The second insulating layer PAS2_1 may include a first pattern portion PT1, second pattern portions PT2, and a third pattern portion PT3 and may further include a plurality of fourth pattern portions PT4 and a fifth pattern portion PT5. The first pattern portion PT1, the second pattern portions PT2, and the third pattern portion PT3 are the same as their respective counterparts of the display device 10.

The fourth pattern portions PT4 may be disposed between the emission area EMA and a subarea SA of a lower neighboring subpixel SPXn. The fourth pattern portions PT4 may be disposed to fill the gaps between the second bank part BP2_1 and the second bank protrusion portions P2 of the outer banks EBN and thus to compensate for the height differences generated by the second bank part BP2_1 and the second bank protrusion portions P2. In one example, both side surfaces of each of the fourth pattern portions PT4 may be in contact with the second bank part BP2_1 and the second bank protrusion portions P2. In some embodiments, the height from a via layer VIA to the top surfaces of the fourth pattern portions PT4 may be the same as the height of the top surfaces of the bank protrusion portions (P1 and P2) of the outer banks EBN and the top surfaces of the bank parts BP.

The fourth pattern portions PT4 of the second insulating layer PAS2_1 may overlap with the electrodes RME that are disposed below the fourth pattern portions PT4. The electrodes RME may be disposed in and across the emission area EMA and the subarea SA through the gaps between the bank parts BP and the bank protrusion portions (P1 and P2). The electrodes RME may be disposed not only on an upper side of the emission area EMA where electrode contact holes (CTD and CTS) are formed, but also on a lower side of the emission area EMA between the second bank part BP2_1 and the second bank protrusion portions P2. The fourth pattern portions PT4 may cover parts of the electrodes RME disposed between the second bank part BP2_1 and the second bank protrusion portions P2, on the lower side of the emission area EMA.

The fifth pattern portion PT5 may connect the first pattern portion PT1 and the fourth pattern portions PT4 and may be disposed in the emission area EMA. The fifth pattern portion PT5 may extend in a second direction DR2 and may be disposed on second sides, in a first direction DR1, of inner banks IBN, for example, on the lower sides of the inner banks IBN, between the second bank part BP2 and the inner banks IBN. In one example, part of the fifth pattern portion PT5 may be disposed to be in contact with the second bank part BP2 and may compensate for the height difference generated between the inner banks IBN and the second bank part BP2 or between the inner banks IBN and the second bank part BP2. As will be described later, connecting electrodes CNE may be disposed adjacent to the second bank part BP2 that is disposed on the lower side of the emission area EMA. The connecting electrodes CNE may be disposed on the fifth pattern portion PT5 of the second insulating layer PAS2_1 and may prevent any residues from being left behind due to the height differences in the bank layer BNL.

The first insulating layer PAS1 may have the same structure as the first insulating layer PAS1 of FIGS. 2 and 4. That is, the first insulating layer PAS1 may cover the inner banks IBN and the electrodes RME, but may be spaced from the outer banks EBN and the bank parts BP.

Figure 18:
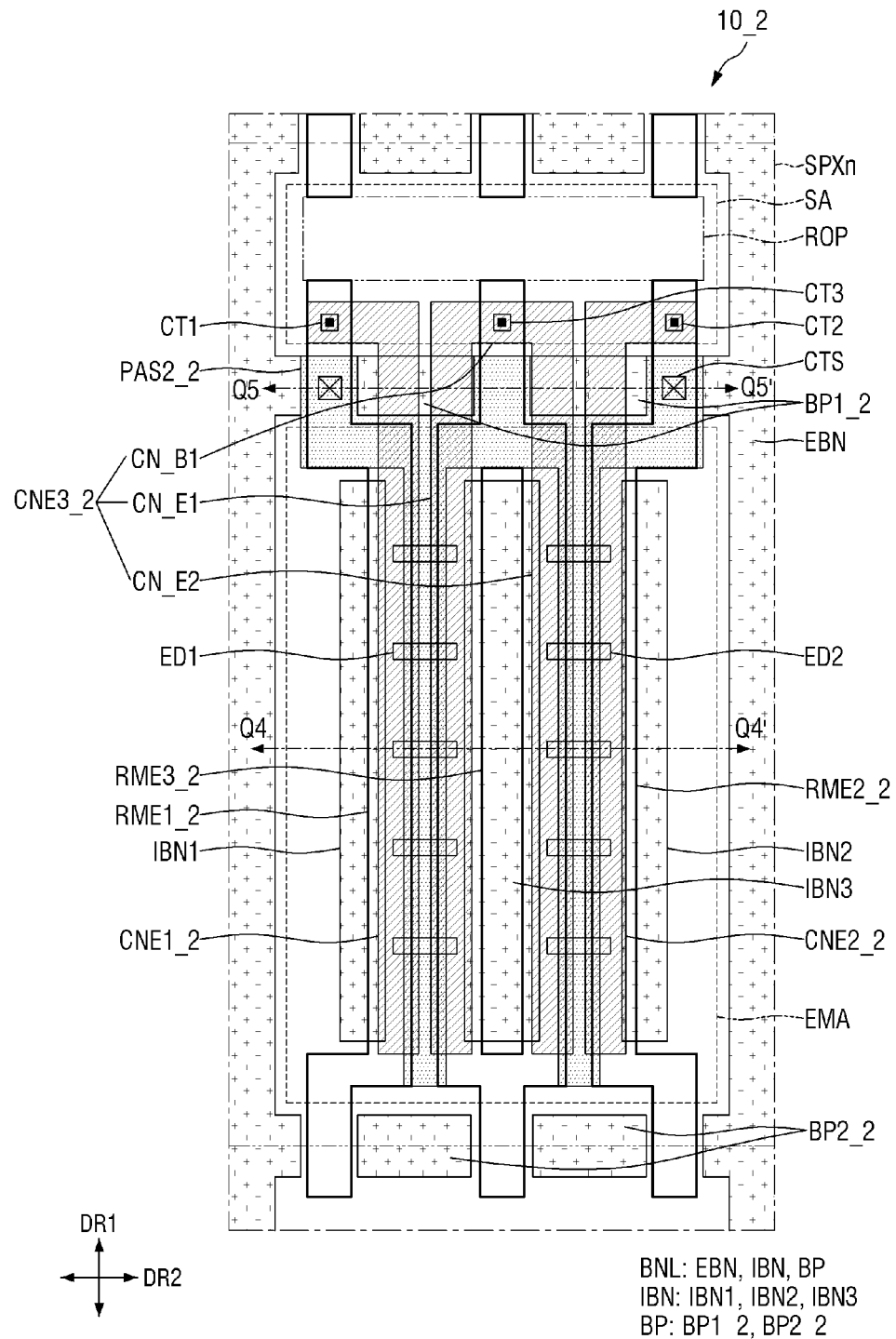
FIG. 18 is a plan view of a subpixel of a display device according to an embodiment of the present disclosure.
Figure 19:
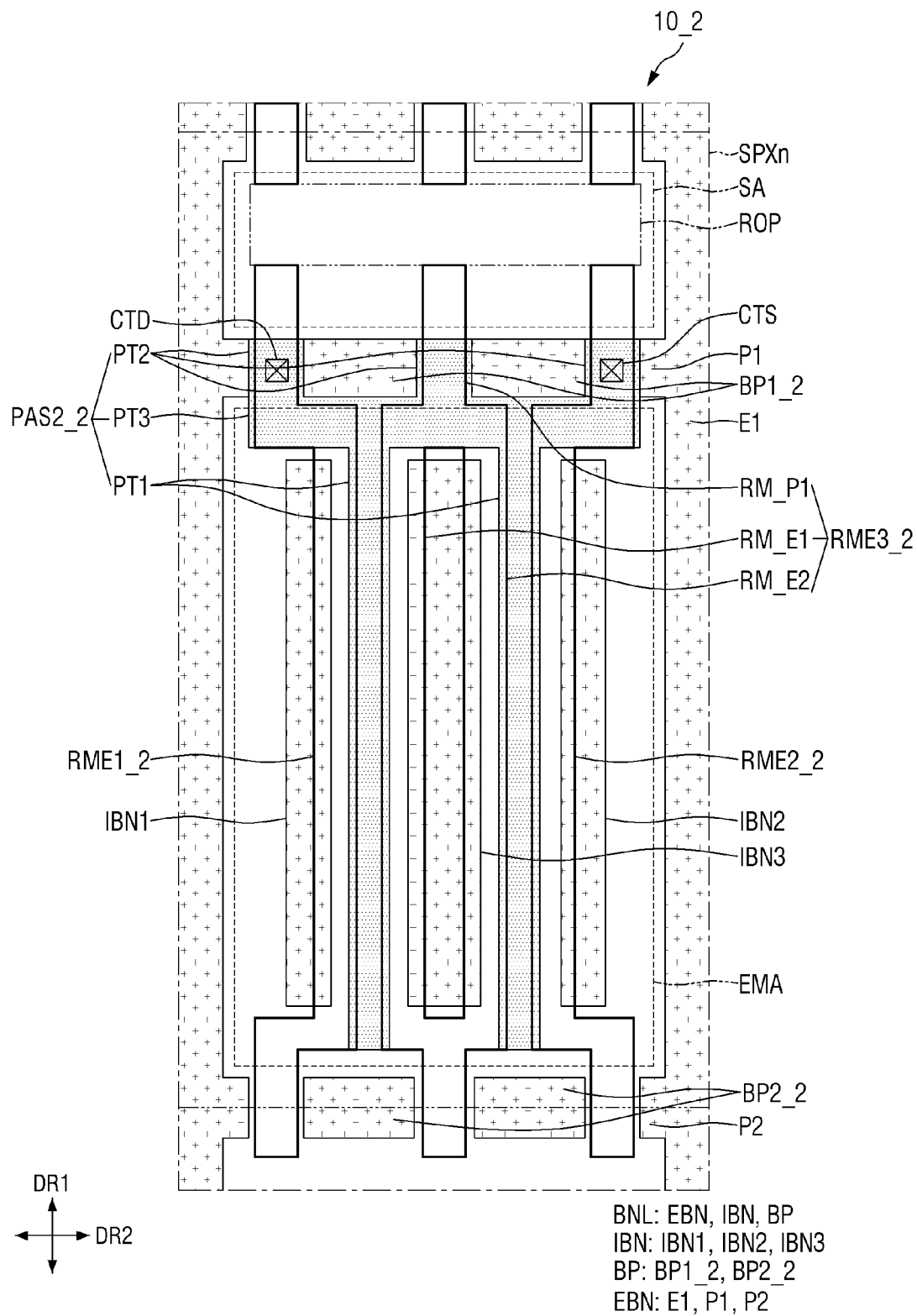
FIG. 19 is a plan view illustrating the layout of banks, a plurality of electrodes, and a second insulating layer in the subpixel of FIG. 18.
Figure 20:
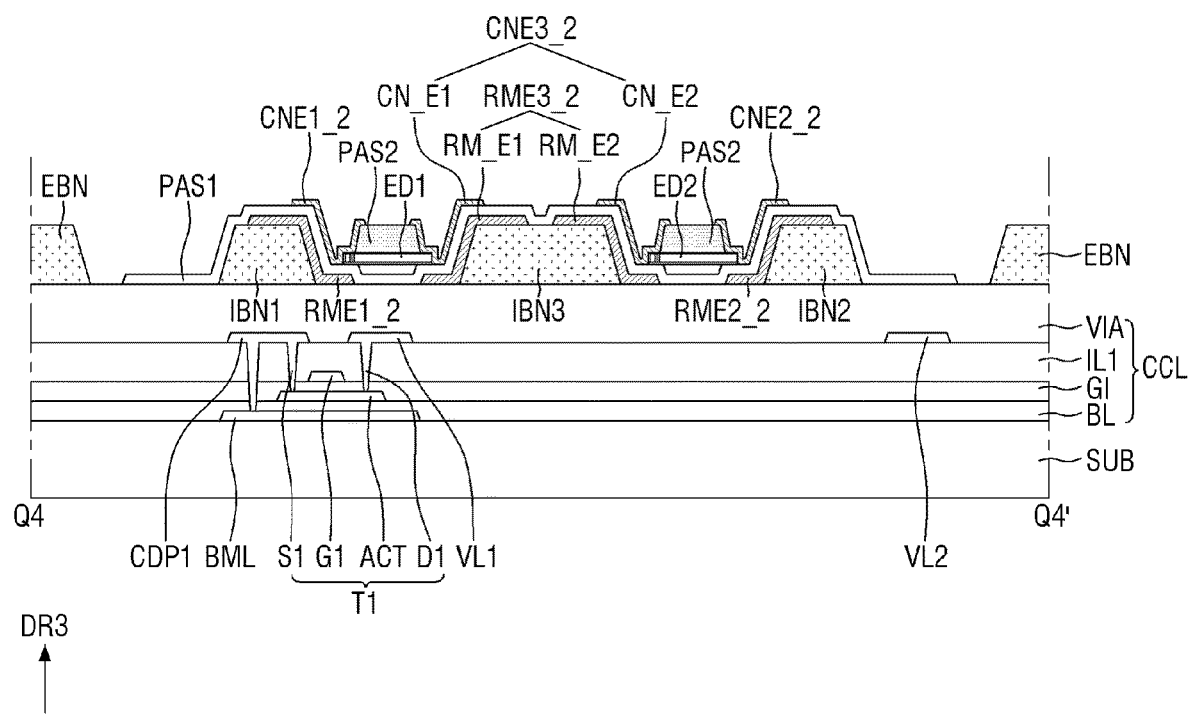
FIG. 20 is a cross-sectional view taken along the line Q4-Q4' of FIG. 18.
Figure 21:
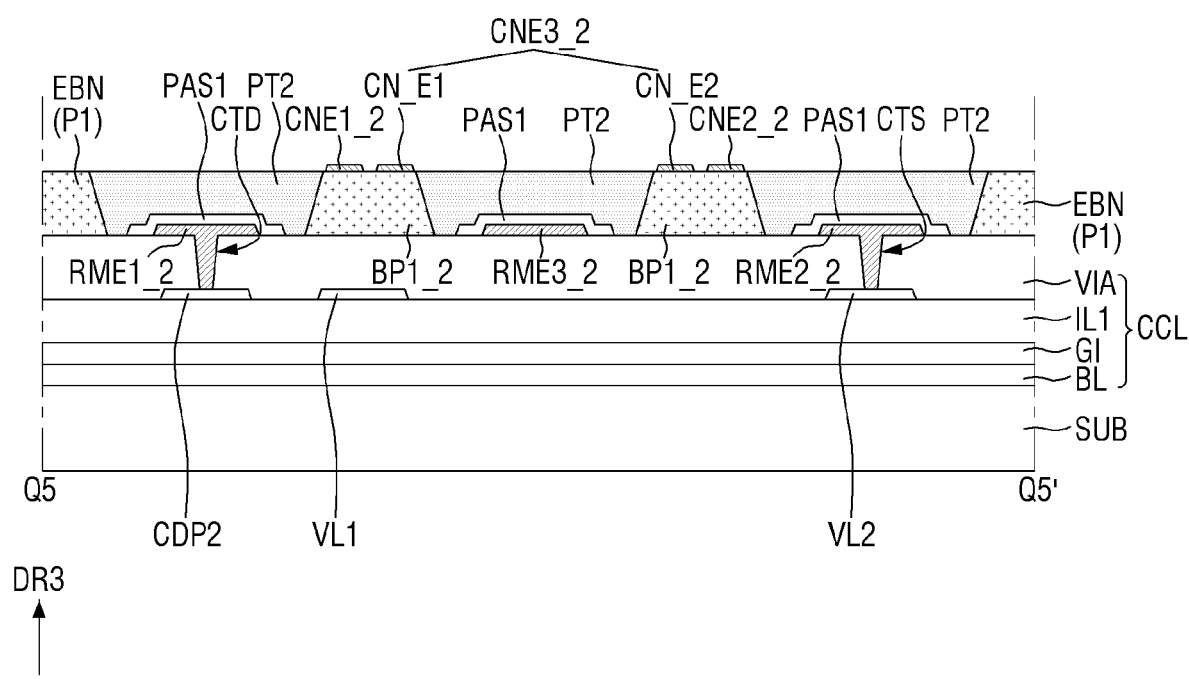
FIG. 21 is a cross-sectional view taken along the line Q5-Q5' of FIG. 18.

FIG. 18 is a plan view of a subpixel of a display device according to another embodiment of the present disclosure. FIG. 19 is a plan view illustrating the layout of banks, a plurality of electrodes, and a second insulating layer in the subpixel of FIG. 18. FIG. 20 is a cross-sectional view taken along line Q4-Q4' of FIG. 18. FIG. 21 is a cross-sectional view taken along line Q5-Q5' of FIG. 18. FIGS. 18 and 19 illustrate the layout of a bank layer BNL, electrodes RME, and a second insulating layer PAS2_2, but not the layout of a first insulating layer PAS1.

Referring to FIGS. 18-21, a display device 10_2 may include more than two electrodes RME, i.e., first, second, and third electrodes RME1_2, RME2_2, and RME3_2, inner banks IBN, and a plurality of bank parts BP. As the display device 10_2 includes more than two electrodes RME in a subpixel SPXn, the display device 10_2 may include a relatively large number of light-emitting elements ED disposed in the subpixel SPXn. The embodiment of FIGS. 18-21 differs from the embodiment of FIG. 2 in the number of electrodes RME disposed in the subpixel SPXn. The display device 10_2 will hereinafter be described, focusing on inner banks IBN, the electrodes RME, the bank parts BP, and connecting electrodes CNE.

The inner banks IBN may include first and second inner banks IBN1 and IBN2 and may further include a third inner bank IBN3 that has a different width from the first and second inner banks IBN1 and IBN2. The third inner bank IBN3 may be disposed between the first and second inner banks IBN1 and IBN2 and may extend in a first direction DR1. The first, second, and third inner banks IBN1, IBN2, and IBN3 may have the same length in the first direction DR1, but the third inner bank IBN3 may have a larger width than the first and second inner banks IBN1 and IBN2 in a second direction DR2.

The third inner bank IBN3 may be disposed to be spaced from the first and second inner banks IBN1 and IBN2 in the second direction DR2. The third inner bank IBN3 may have a larger width than the first inner bank IBN1 so that a plurality of electrode extensions (RM_E1 and RM_E2) of the third electrode RME3_2 may be disposed. Light-emitting elements ED may be disposed between the first and third inner banks IBN1 and IBN3 and between the second and third inner banks IBN2 and IBN3.

A plurality of first bank parts BP1_2 or a plurality of second bank parts BP2_2 may be disposed between bank protrusion portions (P1 and P2) of outer banks EBN, which are spaced from one another. The first bank parts BP1_2 may be disposed between first bank protrusion portions P1 of the outer banks EBN to be spaced from one another. Gaps may be formed between one of the first bank protrusion portion P1 and one of the first bank parts BP1_2, between the first bank parts BP1_2, and between the other first bank part BP1_2 and the other first bank protrusion portion P1, between an emission area EMA and a subarea SA of the subpixel SPXn. The first bank protrusion portions P1 may have a smaller width than the first bank protrusion portions P1 of FIG. 2 in the second direction DR2 so that the first banks BP1_2 may all be disposed between the first bank protrusion portions P1.

Similarly, the second bank parts BP2 may be disposed between second bank protrusion portions P2 of the outer banks EBN to be spaced from one another. Gaps may be formed between one of the second bank protrusion portion P2 and one of the second bank parts BP2_2, between the second bank parts BP2_2, and between the other second bank part BP2_2 and the other second bank protrusion portion P2, between the emission area EMA and the subarea SA. The second bank protrusion portions P2 may have a smaller width than the second bank protrusion portions P2 of FIG. 2 in the second direction DR2 so that the second banks BP2_2 may all be disposed between the second bank protrusion portions P2.

As described above, the layout of the bank parts BP may correspond to the layout and the shape of electrodes RME that will hereinafter be described. Three electrodes RME may be disposed in and across the emission area EMA and the subarea SA, between the emission area EMA and the subarea SA. Accordingly, two first bank parts BP1_2 and two second bank parts BP2_2 may be disposed and spaced from each other between the emission area EMA and the subarea SA or between the emission area EMA and a subarea SA of a lower neighboring subpixel SPXn, and three gaps may be formed between the bank parts BP and between the bank parts BP and the bank protrusion portions (P1 and P2). In one example, the left first bank part BP1_2 and the left second bank part BP2_2 may be spaced from each other along the first direction DR1 in parallel to the gap between the first and third inner banks IBN1 and IBN3, and the right first bank part BP1_2 and the right second bank part BP2_2 may be spaced from each other along the first direction DR1 in parallel to the gap between the second and third inner banks IBN2 and IBN3.

Electrode contact holes (CTD and CTS), which penetrate a via layer VIA, may be formed between the first bank parts BP1_2 and the first bank protrusion portions P1. A first electrode contact hole CTD may be formed between the left bank protrusion portion P1 and the left first bank part BP1_2, and a second electrode contact hole CTS may be formed between the right first bank protrusion portion P1 and the right first bank part BP1_2. The first and second electrodes RME1_2 and RME2_2 may be disposed on the electrode contact holes (CTD and CTS).

As described above with reference to FIG. 3, the first electrode RME1_2 may be disposed on the first inner bank IBN1, and the second electrode RME2_2 may be disposed on the second inner bank IBN2.

The third electrode RME3_2 may be disposed on the third inner bank IBN3, and part of the third electrode RME3_2 may be disposed between the first bank parts BP1_2 and between the second bank parts BP2_2. In one example, the third electrode RME3_2 may include first and second electrode extensions RM_E1 and RM_E2, which extend in the first direction DR1, on the third inner bank IBN3, and a plurality of electrode connectors RM_P1 that connect the electrode extensions (RM_E1 and RM_E2) and are disposed between the bank parts BP.

The first electrode extension RM_E1 may be spaced from, and face, part of the first electrode RME1_2 that extends in the first direction DR1 and may be disposed on the third inner bank IBN3. The first electrode extension RM_E1 may be disposed on a side of the third inner bank IBN3 that faces the first inner bank IBN1. The second electrode extension RM_E2 may be spaced from, and face, part of the second electrode RME2_2 that extends in the first direction DR1 and may be disposed on the third inner bank IBN3. The second electrode extension RM_E2 may be disposed on a side of the third inner bank IBN3 that faces the second inner bank IBN2. The first and second electrode extensions RM_E1 and RM_E2 may be spaced from each other, in part, on the third inner bank IBN3, in the second direction DR2.

The electrode connectors RM_P1 may connect the first and second electrode extensions RM_E1 and RM_E2. Each of the electrode connectors RM_P1 may include a part that is disposed on both sides of one of the electrode extensions (RM_E1 and RM_E2) and extends in the second direction DR2. The first and second electrode extensions RM_E1 and RM_E2 may be connected to each other in the parts of the electrode connectors RM_P1 that extend in the second direction DR2. Also, the electrode connectors RM_P1 may include protruding parts that protrude in the first direction DR1, and the protruding parts of the electrode connectors RM_P1 may be disposed even in the subarea SA through the gaps between the bank parts BP. In one example, the protruding part of an electrode connector RM_P1 disposed on the upper side of the emission area EMA may be disposed between the first bank parts BP1_2, and the protruding part of an electrode connector RM_P1 disposed on the lower side of the emission area EMA may be disposed between the second bank parts BP2_2. The electrode connectors RM_P1 of the subpixel SPXn may be spaced, in a separation part ROP of the subpixel SPXn, from electrode connectors RM_P1 of an upper neighboring subpixel SPXn. The third electrode RME3_2 may generally extend in the first direction DR1 and may branch off into two electrode extensions, i.e., the first and second electrode extensions RM_E1 and RM_E2, in the emission area EMA.

The third electrode RME3_2, unlike the first and second electrodes RME1_2 and RME2_2, may not be connected to third conductive layers below the via layer VIA. The third electrode RME3_2 may be connected to a third connecting electrode CNE3_2, and electrical signals that flow along the light-emitting elements ED may be applied to the third electrode RME3_2. As will be described later, the third electrode RME3_2 may provide electrical connection paths for different light-emitting elements ED together with the third connecting electrode RME3_2.

The light-emitting elements ED may be disposed between the first and third inner banks IBN1 and IBN3 and between the second and third inner banks IBN2 and IBN3. First end portions of first light-emitting elements ED1, which are light-emitting elements ED disposed between the first and third inner banks IBN1 and IBN3, may be disposed on the first electrode RME1_2, and second end portions of the first light-emitting elements ED1 may be disposed on the first electrode extension RM_E1 of the third electrode RME3_2. First end portions of second light-emitting elements ED2 that are light-emitting elements ED disposed between the second and third inner banks IBN2 and IBN3, may be disposed on the second electrode extension RM_E2 of the third electrode RME3_2, and second end portions of the second light-emitting elements ED2 may be disposed on the second electrode RME2_2. In one example, the first end portions of the first light-emitting elements ED1 and the first end portions of the second light-emitting elements ED2 may face the same direction, and the second end portions of the first light-emitting elements ED1 and the second end portions of the second light-emitting elements ED2 may face the same direction.

The second insulating layer PAS2_2 may include a plurality of first pattern portions PT1, that are disposed on the light-emitting elements ED, between the inner banks IBN, a plurality of second pattern portions PT2 that are disposed between the first bank parts BP1_2 and the first bank protrusion portions P1 and between the first bank parts BP1_2, and a third pattern portion PT3 that connects the first pattern portions PT1 and the second pattern portions PT2.

The first pattern portions PT1 may be disposed between the first and third inner banks IBN1 and IBN3 and between the second and third inner banks IBN2 and IBN3. The first pattern portions PT1 may extend in the first direction DR1 and may be disposed to surround the first light-emitting elements ED1 and the second light-emitting elements ED2.

The second pattern portions PT2 may be disposed between the emission area EMA and the subarea SA. The second pattern portions PT2 may be disposed to fill the gaps between the first bank parts BP1_2 and the first bank protrusion portions P1 and between the first bank parts BP1_2 and may compensate for the height differences generated by the first bank parts BP1_2 and the first bank protrusion portions P1. In one example, one side surface of each of the second pattern portions PT2 of the second insulating layer PAS2_2 may be in contact with one of the first bank parts BP1_2 or one of the first bank protrusion portions P1. Both side surfaces of each of second pattern portions PT2 disposed between the first bank parts BP1_2 and the first bank protrusion portions P1 may be in contact with one of the first bank parts BP1_2 and one of the first bank protrusion portions P1, and both side surfaces of a second pattern portion PT2 disposed between the first bank parts BP1_2 may be in contact with different first bank parts BP1_2. The second pattern portions PT2 disposed between the first bank parts BP1_2 and the first bank protrusion portions P1 may overlap with the electrode contact holes (CTD and CTS).

The third pattern portion PT3 may connect the first pattern portions PT1 and the second pattern portions PT2 and may be disposed in the emission area EMA. The third pattern portion PT3 may extend in the second direction DR2 and may be disposed on first sides, in the first direction DR1, of the inner banks IBN, for example, on the upper sides of the first inner banks IBN, between the first bank parts BP1_2 and the inner banks IBN.

As a plurality of first bank parts BP1_2 are disposed between the emission area EMA and the subarea SA, the second insulating layer PAS2_2 may include a relatively large number of second pattern portions PT2 and may thus compensate for the height differences generated by the elements of the bank layer BNL. FIG. 18 illustrates that the second insulating layer PAS2_2 is not disposed between the second bank parts BP2_2 and between the second bank parts BP2_2 and the second bank protrusion portions P2, but the present disclosure is not limited thereto. In the embodiment of FIGS. 18-21, like in the embodiment of FIG. 17, as the second insulating layer PAS2_2 further includes the fourth pattern portions PT4 and the fifth pattern portion PT5, the second insulating layer PAS2_2 may be disposed even between the second bank parts BP2_2 and between the second bank parts BP2_2 and the second bank protrusion portions P2.

A plurality of connecting electrodes CNE may include first, second, and third connecting electrodes CNE1_2, CNE2_2, and CNE3_2 that are disposed on the first, second, and third electrodes RME1_2, RME2_2, and RME3_2, respectively.

The first connecting electrode CNE1_2 may be in contact with the first electrode RME1_2 and the first end portions of the first light-emitting elements ED1. The first connecting electrode CNE1_2 may be in contact with the first electrode RME1_2 through a first contact CT1 that penetrates the first insulating layer PAS1. The second connecting electrode CNE2_2 may be in contact with the second electrode RME2_2 and the second end portions of the second light-emitting elements ED2. The second connecting electrode CNE2_2 may be in contact with the second electrode RME2_2 through a second contact CT2 that penetrates the first insulating layer PAS1. The first and second connecting electrodes CNE1_2 and CNE2_2 may extend in the first direction DR1 from the emission area EMA to the subarea SA.

The third connecting electrode CNE3_2 may include a first extension CN_E1, which is disposed on the first electrode extension RM_E1 and extends in the first direction DR1, a second extension CN_E2, which is disposed on the second electrode extension RM_E2 and extends in the first direction DR1, and a first connector CN_B1, which connects the first and second extensions CN_E1 and CN_E2. The first and second extensions CN_E1 and CN_E2 of the third connecting electrode CNE3_2 may be spaced from each other in the second direction DR2, between the first and second connecting electrodes CNE1_2 and CNE2_2. The first extension CN_E1 may be spaced from, and face, the first connecting electrode CNE1_2, and the second extension CN_E2 may be spaced from, and face, the second connecting electrode CNE2_2. The first extension CN_E1 may be in contact with the second end portions of the first light-emitting elements ED1, and the second extension CN_E2 may be in contact with the first end portions of the second light-emitting elements ED2.

The first connector CN_B1 may extend in the second direction DR2 in the subarea SA and may connect the first and second extensions CN_E1 and CN_E2. The first connector CN_B1 may overlap with one of the electrode connectors RM_P1 of the third electrode RME3_2 and may be connected to the third electrode RME3_2 through a third contact CT3 that penetrates the first insulating layer PAS1.

The first and second extensions CN_E1 and CN_E2 may be disposed in and across the emission area EMA and the subarea SA. The third pattern portion PT3 of the second insulating layer PAS2_2 may be disposed in the emission area EMA, between the inner banks IBN and the first bank parts BP1_2, and the first and second extensions CN_E1 and CN_E2 may be disposed on the third pattern portion PT3 to extend in the first direction DR1. As the third connecting electrode CNE3_2 is disposed in and across the emission area EMA and the subarea SA through regions where height differences are compensated for by the third pattern portion PT3, a short circuit that may be caused by any residues can be prevented.

The first end portions of the first light-emitting elements ED1 may be electrically connected to the first electrode RME1_2 via the first connecting electrode CNE1_2, and the second end portions of the second light-emitting elements ED2 may be electrically connected to the second electrode RME2_2 via the second connecting electrode CNE2_2. The second end portions of the first light-emitting elements ED1 and the first end portions of the second light-emitting elements ED2 may be connected in series by the third connecting electrode CNE3_2. The light-emitting elements ED may be connected in parallel, and groups of light-emitting elements disposed at different locations with respect to the third inner bank IBN3 may be connected in series. In the embodiment of FIGS. 18-21, unlike in the embodiment of FIG. 2, the display device 10_2 may include a relatively large number of light-emitting elements ED in each subpixel SPXn and may thus increase the amount of light emitted per unit area.

The first insulating layer PAS1 of the display device 10_2, which is not illustrated in FIGS. 18 and 19, may have the same structure as the first insulating layer PAS1 of FIGS. 2 and 4. That is, the first insulating layer PAS1 may cover the inner banks IBN and the first, second, and third electrodes RME1_2, RME2_2, and RME3_2, but may be spaced from the outer banks EBN and the bank parts BP.

Figure 22:
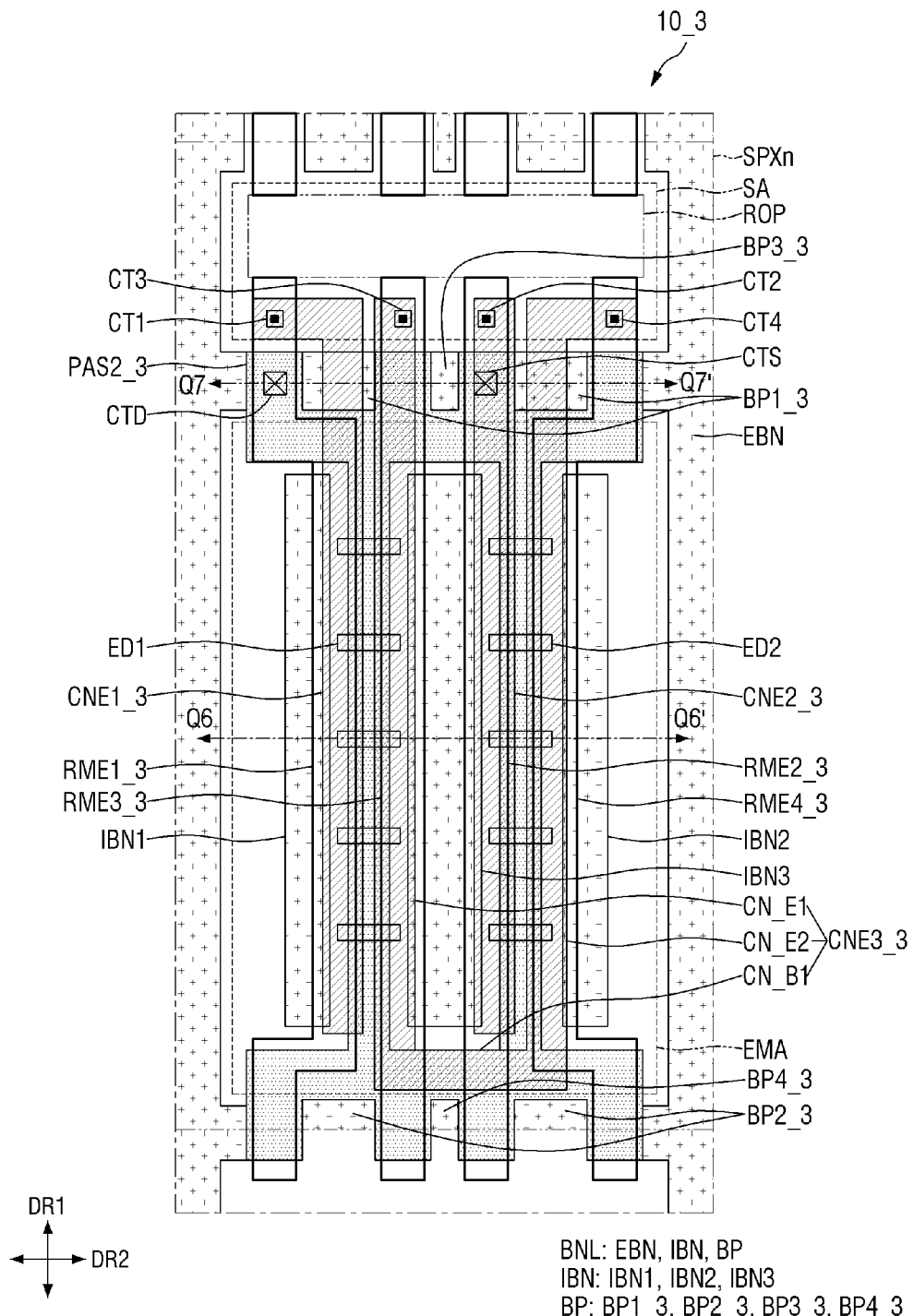
FIG. 22 is a plan view of a subpixel of a display device according to an embodiment of the present disclosure.
Figure 23:
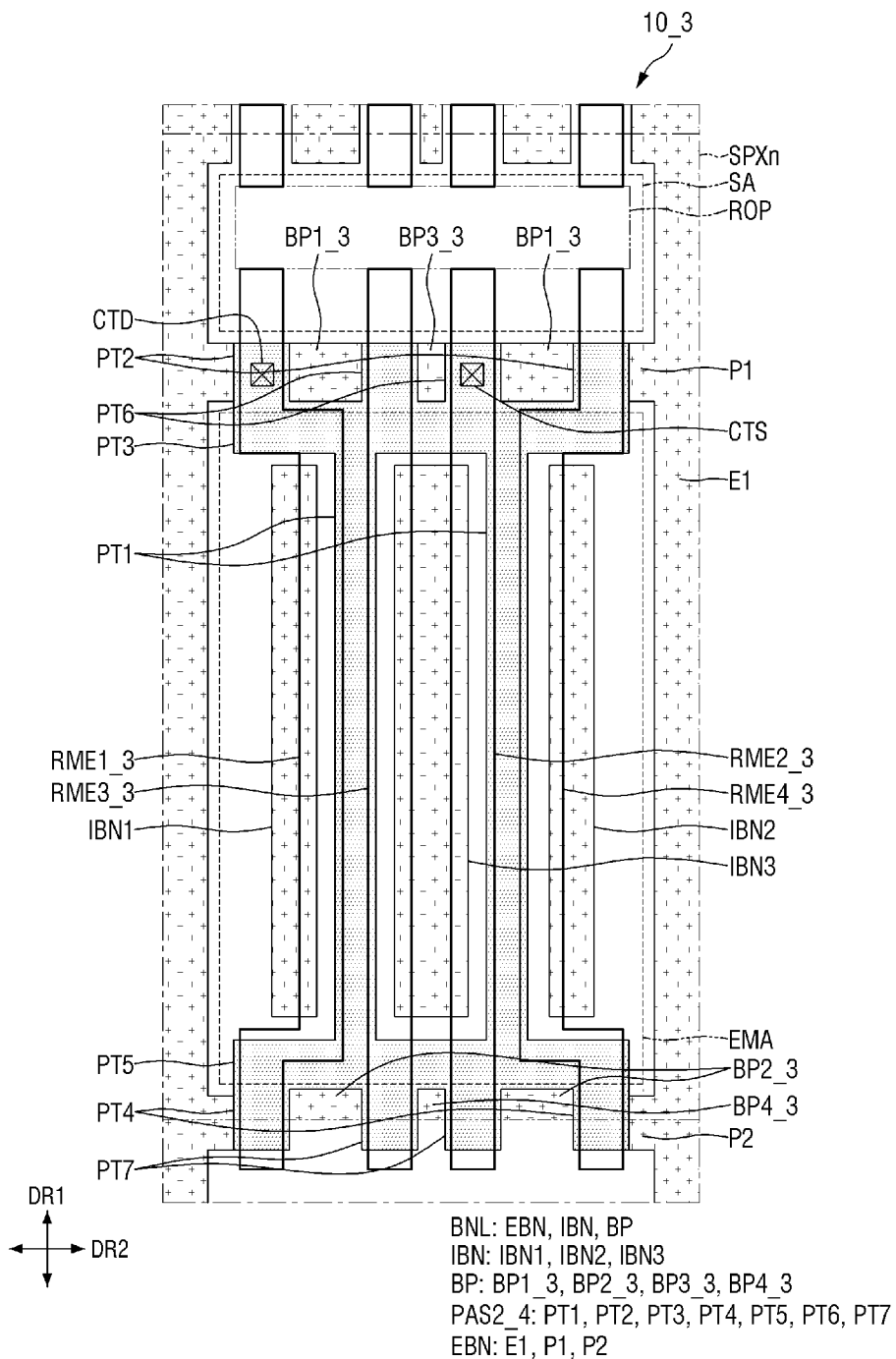
FIG. 23 is a plan view illustrating the layout of banks, a plurality of electrodes, and a second insulating layer in the subpixel of FIG. 22.
Figure 24:
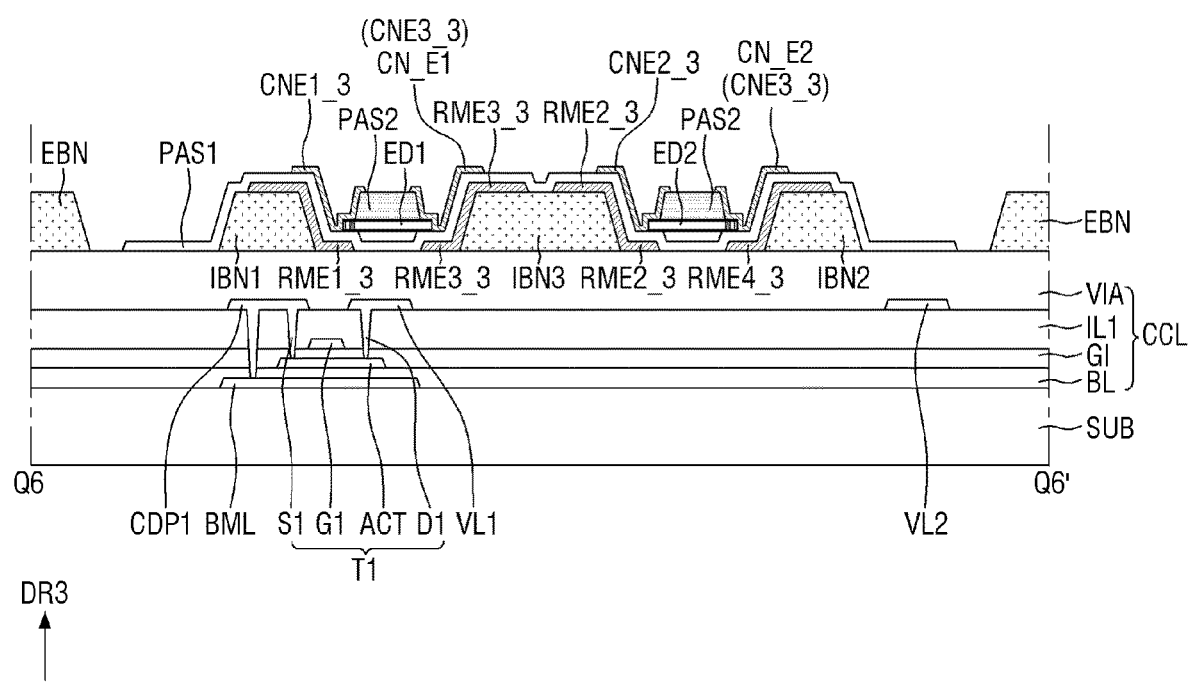
FIG. 24 is a cross-sectional view taken along the line Q6-Q6' of FIG. 22.
Figure 25:
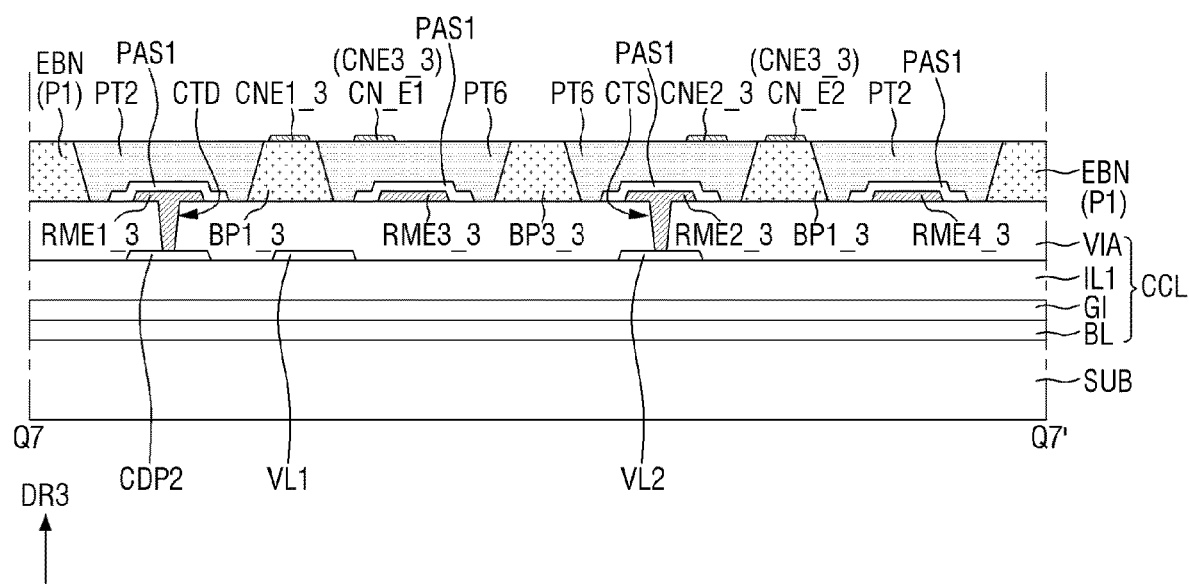
FIG. 25 is a cross-sectional view taken along the line Q7-Q7' of FIG. 22.

FIG. 22 is a plan view of a subpixel of a display device according to an embodiment of the present disclosure. FIG. 23 is a plan view illustrating the layout of banks, a plurality of electrodes, and a second insulating layer in the subpixel of FIG. 22. FIG. 24 is a cross-sectional view taken along the line Q6-Q6' of FIG. 22. FIG. 25 is a cross-sectional view taken along the line Q7-Q7' of FIG. 22. FIGS. 22 and 23 illustrate the layout of a bank layer BNL, electrodes RME, and a second insulating layer PAS2_2, but not the layout of a first insulating layer PAS1.

Referring to a display device 10_3 of FIGS. 22-25, electrodes RME may be separated from one another and may extend in one direction. In the embodiment of FIGS. 22-25, the display device 10_3 may include, in a subpixel SPXn, four electrodes RME, i.e., first, second, third, and fourth electrodes RME1_3, RME2_3, RME3_3, and RME4_3 that extend in a first direction DR1 and are spaced from one another in a second direction DR2. The display device 10_3 may include a plurality of first bank parts BP1_3 and a plurality of second bank parts BP2_3 between an emission area EMA and a subarea SA of the subpixel SPXn and may further include a third bank part BP3_3 that is disposed between the first bank parts BP1_3, and a fourth bank part BP4_3 that is disposed between the second bank parts BP2_3. The display device 10_3 will hereinafter be described, focusing mainly on the differences with the display device 10, 10_1, or 10_2.

The bank layer BNL may include first, second, and third inner banks IBN1, IBN2, and IBN3, outer banks EBN, and a plurality of bank parts BP. The inner banks IBN and the outer banks EBN are the same as their respective counterparts of FIGS. 18-21.

The bank parts BP may include the first bank parts BP1_3 that are spaced from first bank protrusion portions P1 of the outer banks EBN in the second direction DR2, and the third bank part BP3_3 that are disposed between the first bank parts BP1_3. Also, the bank parts BP may include the second bank parts BP2_3 that are spaced from second bank protrusion portions P2 of the outer banks EBN in the second direction DR2, and the fourth bank part BP4_3 that are disposed between the second bank parts BP2_3.

Gaps may be formed between one of the first bank protrusion portions P1 and one of the first bank parts BP1_3, between the first bank parts BP1_3 and the third bank part BP3_3, and between the other first bank part BP1_3 and the other first bank protrusion portion P1, between the emission area EMA and the subarea SA. The first bank protrusion portions P1 may have a smaller width than the first bank protrusion portions P1 of FIG. 18 in the second direction DR2 so that the first bank parts BP1_3 and the third bank part BP3_3 may all be disposed between the first bank protrusion portions P1.

Gaps may be formed between one of the second bank protrusion portions P2 and one of the second bank parts BP2_3, between the second bank parts BP2_3 and the fourth bank part BP4_3, and between the other second bank part BP2_3 and the other second bank protrusion portion P2, between the emission area EMA and a subarea SA of a lower neighboring subpixel SPXn. The second bank protrusion portions P2 may have a smaller width than the second bank protrusion portions P2 of FIG. 18 in the second direction DR2 so that the second bank parts BP2_3 and the fourth bank part BP4_3 may all be disposed between the second bank protrusion portions P2.

As described above, the layout of the bank parts BP may correspond to the layout and the shape of the electrodes RME that will hereinafter be described. Four electrodes RME, i.e., the first, second, third, and fourth electrodes RME1_3, RME2_3, RME3_3, and RME4_3, may be disposed in and across the emission area EMA and the subarea SA, between the emission area EMA and the subarea SA. Accordingly, two first bank parts BP1_3, two second bank parts BP2_3, one third bank part BP3_3, and one fourth bank part BP4_3 may be disposed between the emission area EMA and the subarea SA or between the emission area EMA and the subarea SA of the lower neighboring subpixel SPXn to be spaced from one another, and four gaps may be formed between the bank parts BP and between the bank parts BP and bank protrusion portions (P1 and P2).

In one example, the left first bank part BP1_3 and the left second bank part BP2_3 may be spaced from each other along the first direction DR1 in parallel to the gap between the first and third inner banks IBN1 and IBN3, and the right first bank part BP1_3 and the right second bank part BP2_3 may be spaced from each other along the first direction DR1 in parallel to the gap between the second and third inner banks IBN2 and IBN3. The third and fourth bank parts BP3_3 and BP4_3 may be spaced from each other along the first direction DR1 in parallel to the third inner bank IBN3. Accordingly, the first bank parts BP1_3 and the second bank parts BP2_3 may have a greater width than the third and fourth bank parts BP3_3 and BP4_3.

The electrodes RME may be arranged in the order of the first, third, second, and fourth electrodes RME1_3, RME3_3, RME2_3, and RME4_3 along the second direction DR2. Electrodes RME disposed on both outer sides, in the second direction DR2, of the center of the emission area EMA, i.e., the first and fourth electrodes RME1_3 and RME4_3, may include parts that are bent in the second direction DR2 and then in the first direction DR1. On the contrary, the second and third electrodes RME2_3 and RME3_3, which are disposed between the first and fourth electrodes RME1_3 and RME4_3, may extend straight in the first direction DR1 without being bent.

The first electrode RME1_3 may be disposed in part in the gaps between the left first bank protrusion portion P1 and the left first bank part BP1_3 and between the left second bank protrusion portion P2 and the left second bank part BP2_3. The third electrode RME3_3 may be disposed in part between the left first bank part BP1_3 and the third bank part BP3_3 and between the left second bank part BP2_3 and the fourth bank part BP4_3, and the second electrode RME2_3 may be disposed in part between the third bank part BP3_3 and the right first bank part BP1_3 and between the fourth bank part BP4_3 and the right second bank part BP2_3. The fourth electrode RME4_3 may be disposed in part in the gaps between the right first bank part BP1_3 and the right first bank protrusion portion P1 and between the right second bank part BP2_3 and the right second bank protrusion portion P2.

Electrode contact holes (CTD and CTS), which penetrate a via layer VIA, may be formed between the first bank parts BP1_3 and the first bank protrusion portions P1 or between the first bank parts BP1_3 and the third bank part BP3_3. A first electrode contact hole CTD may be formed between the left bank protrusion portion P1 and the left first bank part BP1_3, and a second electrode contact hole CTS may be formed between the third bank part BP3_3 and the right first bank part BP1_3. The first electrodes RME1_3 and the second electrodes RME2_3 may be disposed on the electrode contact holes (CTD and CTS).

The first electrode RME1_3 may be disposed in part on the first inner bank IBN1. The first electrode RME1_3 may be disposed in part in the gaps between the left first bank protrusion portion P1 and the left first bank part BP1_3 and between the left second bank protrusion portion P2 and the left second bank part BP2_3, between the emission area EMA and the subarea SA.

The fourth electrode RME4_3 may be symmetrical with the first electrode RME1_3. The fourth electrode RME4_3 may be spaced from the first electrode RME1_3 in the second direction DR2 and may be disposed in part on the second inner bank IBN2. The fourth electrode RME4_3 may be disposed in part in the gaps between the right first bank protrusion portion P1 and the right first bank part BP1_3 and between the right second bank protrusion portion P2 and the right second bank part BP2_3, between the emission area EMA and the subarea SA. The first and fourth electrodes RME1_3 and RME4_3 may include parts that are bent in the second direction DR2 and then in the first direction DR1.

The third electrode RME3_3 may be spaced from, and face, the first electrode RME1_3 in the second direction DR2 and may be disposed on one side of the third inner bank IBN3. The third electrode RME3_3 may extend in the first direction DR1 and may be disposed in the gaps between the left first bank part BP1_3 and the third bank part BP3_3 and between the left second bank part BP2_3 and the fourth bank part BP4_3, between the emission area EMA and the subarea SA.

The second electrode RME2_3 may be spaced from, and face, the fourth electrode RME4_3 in the second direction DR2 and may be disposed on the other side of the third inner bank IBN3 to be spaced from the third electrode RME3_3. The second electrode RME2_3 may extend in the first direction DR1 and may be disposed in the gaps between the right first bank part BP1_3 and the third bank part BP3_3 and between the right second bank part BP2_3 and the fourth bank part BP4_3, between the emission area EMA and the subarea SA. In the embodiment of FIGS. 22-25, unlike in the embodiment of FIG. 18, four electrodes RME may be disposed in the subpixel SPXn, and two of the four electrodes RME may extend in the first direction DR1.

The first and second electrodes RME1_3 and RME2_3 may be connected to a third conductive layer below the via layer VIA through the first and second electrode contact holes CTD and CTS, respectively. On the contrary, the third and fourth electrodes RME3_3 and RME4_3 may not be connected to the third conductive layer below the via layer VIA. The third and fourth electrodes RME3_3 and RME4_3 may be connected to a third connecting electrode CNE3_3, and electrical signals that flow along light-emitting elements ED may be applied to the third and fourth electrodes RME3_3 and RME4_3. As will be described later, the third and fourth electrodes RME3_3 and RME4_3 may provide electrical connection paths for different light-emitting elements ED together with the third connecting electrode RME3_3.

First end portions of first light-emitting elements ED1, which are light-emitting elements ED disposed between the first and third inner banks IBN1 and IBN3, may be disposed on the first electrode RME1_3, and second end portions of the first light-emitting elements ED1 may be disposed on the third electrode RME3_3. First end portions of second light-emitting elements ED2, which are light-emitting elements ED disposed between the second and third inner banks IBN2 and IBN3, may be disposed on the fourth electrode RME4_3, and second end portions of the second light-emitting elements ED2 may be disposed on the second electrode RME2_3. In one example, the first end portions of the first light-emitting elements ED1 and the first end portions of the second light-emitting elements ED2 may face the same direction, and the second end portions of the first light-emitting elements ED1 and the second end portions of the second light-emitting elements ED2 may face the same direction.

The second insulating layer PAS2_3 may include a plurality of first pattern portions PT1, which are disposed on the light-emitting elements ED, between the inner banks IBN, a plurality of second pattern portions PT2, which are disposed between the first bank parts BP1_3 and the first bank protrusion portions P1, and a third pattern portion PT3, which connects the first pattern portions PT1 and the second pattern portions PT2. Also, the second insulating layer PAS2_3 may include a plurality of fourth pattern portions PT4, which are disposed between the second bank parts BP2_3 and the second bank protrusion portions P2, and a fifth pattern portion PT5, which connects the first pattern portions PT1 and the fourth pattern portions PT4. Also, the second insulating layer PAS2_3 may include a plurality of sixth pattern portions PT6, which are disposed between the first bank parts BP1_3 and the third bank part BP3_3, and a plurality of seventh pattern portions PT7, which are disposed between the second bank parts BP2_3 and the fourth bank parts BP4_3. The first pattern portions PT1, the second pattern portions PT2, the third pattern portion PT3, the fourth pattern portions PT4, and the fifth pattern portion PT5 may be the same as their respective counterparts of FIGS. 17 and 18.

The sixth pattern portions PT6 may be disposed between the left first bank part BP1_3 and the third bank part BP3_3 and between the third bank part BP3_3 and the right first bank part BP1_3. The sixth pattern portions PT6 may be disposed to fill the gaps between the first bank parts BP1_3 and the third bank part BP3_3 and may compensate for the height differences generated by the first bank parts BP1_3 and the third bank part BP3_3. In one example, both side surfaces of each of the sixth pattern portions PT6 of the second insulating layer PAS2_3 may be in contact with one of the first bank parts BP1_3 and the third bank part BP3_3. A sixth pattern portion PT6 disposed between the third bank part BP3_3 and the right first bank part BP1_3 may overlap with the second electrode contact hole CTS. The sixth pattern portions PT6 may be connected to other pattern portions via the third pattern portion PT3.

Similarly, the seventh pattern portions PT7 may be disposed between the left second bank part BP2_3 and the fourth bank part BP4_3 and between the fourth bank part BP4_3 and the right second bank part BP2_3. The seventh pattern portions PT7 may be disposed to fill the gaps between the second bank parts BP2_3 and the fourth bank part BP4_3 and may compensate for the height differences generated by the second bank parts BP2_3 and the fourth bank part BP4_3. In one example, both side surfaces of each of the seventh pattern portions PT7 of the second insulating layer PAS2_3 may be in contact with one of the second bank parts BP2_3 and the fourth bank part BP4_3. The seventh pattern portions PT7 may be connected to other pattern portions via the fifth pattern portion PT5.

A plurality of connecting electrodes CNE may include a first connecting electrode CNE1_3, which is disposed on the first electrode RME1_3, a second connecting electrode CNE2_3, which is disposed on the second electrode RME2_3, and the third connecting electrode CNE3_3, which is disposed on the third and fourth electrodes RME3_3 and RME4_3.

The first connecting electrode CNE1_3 may be in contact with the first electrode RME1_3 and the first end portions of the first light-emitting elements ED1. The first connecting electrode CNE1_3 may be in contact with the first electrode RME1_3 through a first contact CT1, which penetrates the first insulating layer PAS1. The second connecting electrode CNE2_3 may be in contact with the second electrode RME2_3 and the second end portions of the second light-emitting elements ED2. The second connecting electrode CNE2_3 may be in contact with the second electrode RME2_3 through a second contact CT2, which penetrates the first insulating layer PAS1. The first and second connecting electrodes CNE1_3 and CNE2_3 may extend in the first direction DR1 from the emission area EMA to the subarea SA.

The third connecting electrode CNE3_3 may include a first extension CN_E1, which is disposed on the third electrode RME3_3 and extends in the first direction DR1, a second extension CN_E2, which is disposed on the fourth electrode RME4_3 and extends in the first direction DR1, and a first connector CN_B1, which connects the first and second extensions CN_E1 and CN_E2. The first and second extensions CN_E1 and CN_E2 of the third connecting electrode CNE3_3 may be spaced from each other in the second direction DR2, between the first and second connecting electrodes CNE1_2 and CNE2_2. The first extension CN_E1 may be spaced from, and face, the first connecting electrode CNE1_3, and the second extension CN_E2 may be spaced from, and face, the second connecting electrode CNE2_3. The first extension CN_E1 may be in contact with the second end portions of the first light-emitting elements ED1, and the second extension CN_E2 may be in contact with the first end portions of the second light-emitting elements ED2. The first and second extensions CN_E1 and CN_E2 may be disposed in and across the emission area EMA and the subarea SA. The first extension CN_E1 may be connected to the third electrode RME3_3 through a third contact CT3, which penetrates the first insulating layer PAS1, and the second extension CN_E2 may be connected to the fourth electrode RME4_3 through a fourth contact CT4.

The sixth pattern portions PT6 of the second insulating layer PAS2_3 may be disposed in the emission area EMA, between the inner banks IBN and the first bank parts BP1_3 and between the inner banks IBN and the third bank parts BP3_3, and the first and second extensions CN_E1 and CN_E2 may be disposed on the sixth pattern portions PT6 to extend in the first direction DR1. As the third connecting electrode CNE3_3 is disposed in and across the emission area EMA and the subarea SA through regions where height differences are compensated for by the sixth pattern portions PT6, a short circuit that may be caused by any residues can be prevented.

The first connector CN_B1 may extend in the second direction DR2, on the lower side of the emission area EMA, and may connect the first and second extensions CN_E1 and CN_E2. The first connector CN_B1 may be disposed on the fifth pattern portion PT5 of the second insulating layer PAS2_3. The first connector CN_B1 may be disposed in a region where height differences are compensated for by the second insulating layer PAS2_3.

The first end portions of the first light-emitting elements ED1 may be electrically connected to the first electrode RME1_3 via the first connecting electrode CNE1_3, and the second end portions of the second light-emitting elements ED2 may be electrically connected to the second electrode RME2_3 via the second connecting electrode CNE2_3. The second end portions of the first light-emitting elements ED1 and the first end portions of the second light-emitting elements ED2 may be connected in series by the third connecting electrode CNE3_3.

The first insulating layer PAS1 of the display device 10_3, which is not illustrated in FIGS. 22 and 23, may have the same structure as the first insulating layer PAS1 of FIGS. 2 and 4. That is, the first insulating layer PAS1 may cover the inner banks IBN and the first, second, third, and fourth electrodes RME1_3, RME2_3, RME3_3, and RME4_3, but may be spaced from the outer banks EBN and the bank parts BP.

In concluding the detailed description, those skilled in the art will appreciate that many variations and modifications can be made to the embodiments of the present disclosure without substantially departing from the principles of the present disclosure. Therefore, the disclosed embodiments of the present disclosure are used in a generic and descriptive sense only and not for purposes of limitation.

What is claimed is:

1. A display device comprising:
a plurality of outer banks extending in a first direction and are spaced from one another in a second direction that intersects the first direction;
first and second bank parts spaced from the plurality of outer banks in the second direction between the plurality of outer banks, and spaced from each other in the first direction;
first and second inner banks extending in the first direction between the plurality of outer banks, the first and second inner banks being spaced from each other in the second direction;
first and second electrodes on the first and second inner banks, respectively, and spaced from each other in the second direction;
a plurality of light-emitting elements having first end portions on one of the first and second electrodes, the plurality of light-emitting elements being arranged along the first direction; and
a first insulating layer comprising a first pattern portion between the first and second inner banks, the first pattern portion partially covering the plurality of light-emitting elements, and a plurality of second pattern portions between the first bank part and the outer banks.

2. The display device of claim 1, wherein:
the outer banks comprise bank extension portions extending in the first direction, and a plurality of bank protrusion portions protruding on both sides of the bank extension portions in the second direction;
the bank protrusion portions comprise a first bank protrusion portions and a second bank protrusion portions spaced from the first bank protrusion portions in the first direction;
the first bank part is between first bank protrusion portions of different outer banks;
the second bank part is between second bank protrusion portions of different outer banks; and
the plurality of second pattern portions is between the first bank part and the first bank protrusion portions.

3. The display device of claim 2, wherein each of the first and second inner banks is at an area surrounded by the first bank protrusion portions, the first bank part, the second bank protrusion portions, and the second bank part.

4. The display device of claim 2, wherein:
respective parts of the first and second electrodes are on electrode contact holes located between the first bank protrusion portions and the first bank part; and
the plurality of second pattern portions is on the electrode contact holes.

5. The display device of claim 4, wherein the plurality of second pattern portions is in contact with the first bank protrusion portions and the first bank part.

6. The display device of claim 4, wherein the first insulating layer further comprises a third pattern portion connecting the first pattern portion and the plurality of second pattern portions, and
wherein the third pattern portion extends in the second direction between the first inner bank, the second inner bank, and the first bank part, and is in direct contact with the first bank part.

7. The display device of claim 6, further comprising:
a first connecting electrode on the first electrode and extending in the first direction, the first connecting electrode being in contact with first end portions of the light-emitting elements; and
a second connecting electrode on the second electrode and extending in the first direction, the second connecting electrode being in contact with second end portions of the light-emitting elements,
wherein at least a portion of the first and second connecting electrodes is on the third pattern portion and the first bank part.

8. The display device of claim 2, further comprising:
a third inner bank between the first and second inner banks; and
a third electrode on the third inner bank,
wherein the third electrode comprises a first electrode extension at one side of the third inner bank, a second electrode extension at an other side of the third inner bank, and a plurality of electrode connectors connecting the first and second electrode extensions.

9. The display device of claim 8, wherein:
the plurality of light-emitting elements comprises first light-emitting elements on the first electrode and the first electrode extension, and second light-emitting elements on the second electrode and the second electrode extension, and
first end portions of the first light-emitting elements and first end portions of the second light-emitting elements face one side in the second direction.

10. The display device of claim 8, wherein a plurality of first pattern portions is located between the first and third inner banks and between the second and third inner banks.

11. The display device of claim 8, wherein:
the first bank parts are between the first bank protrusion portions that are spaced from one another in the second direction;
the second bank parts are between the second bank protrusion portions that are spaced from one another in the second direction;
the electrode connectors of the third electrode comprise protruding parts that protrude in the first direction; and
the protruding parts are between the first bank parts or between the second bank parts.

12. The display device of claim 11, wherein:
the plurality of second pattern portions are between the first bank part and the first bank protrusion portions, and
the first insulating layer further comprises a third pattern portion connecting a plurality of first pattern portions and the plurality of second pattern portions.

13. The display device of claim 8, further comprising:
a second insulating layer covering the first inner bank, the second inner bank, the first electrode, and the second electrode, the second insulating layer being spaced from the first and second bank parts,
wherein the second insulating layer is between the first bank part and the first bank protrusion portions.

14. A display device comprising:
a substrate;
a via layer on the substrate;
a plurality of outer banks spaced from one another on the via layer;
a plurality of bank parts on the via layer between the plurality of outer banks, and spaced from the outer bank;
first and second electrodes that are spaced from one another between the plurality of outer banks, at least a portion of the first and second electrodes being located between the plurality of outer banks and the plurality of bank parts;

a first insulating layer covering the first and second electrodes, the first insulating layer being spaced from the plurality of outer banks and the plurality of bank parts;

a plurality of light-emitting elements having at least first end portions on the first or second electrode; and a second insulating layer comprising a first pattern portion partially covering the light-emitting elements, and a plurality of second pattern portions between the plurality of outer banks and the plurality of bank parts.

15. The display device of claim 14, wherein:

the plurality of outer banks extend in a first direction and are spaced from one another in a second direction that intersects the first direction;

the display device further comprises first and second inner banks spaced from the plurality of bank parts in the first direction; and at least parts of the first and second electrodes are on the first and second inner banks.

16. The display device of claim 15, further comprising:

a conductive layer between the via layer and the substrate; and first and second electrode contact holes between the bank parts and the plurality of outer banks, the first and second electrode contact holes exposing parts of the conductive layer through the via layer, wherein the first and second electrode contact holes are spaced from each other by the bank parts.

17. The display device of claim 16, wherein:

the first electrode is in contact with the conductive layer through the first electrode contact hole;

the second electrode is in contact with the conductive layer through the second electrode contact hole; and the plurality of second pattern portions of the second insulating layer overlaps with the first and second electrode contact holes in a thickness direction of the display device.

18. The display device of claim 16, wherein side surfaces of each of the plurality of second pattern portions of the second insulating layer are in direct contact with the bank parts.

19. The display device of claim 16, wherein:

the second insulating layer further comprises a third pattern portion that connects the first pattern portion and the second pattern portions, and the third pattern portion is between the bank parts that are spaced from the first and second inner banks in the first direction.

20. The display device of claim 15, wherein the first and second inner banks have same thickness as the plurality of outer banks and the plurality of bank parts.

* * * * *